United States Patent
Kaneko et al.

(10) Patent No.: US 11,887,816 B2
(45) Date of Patent: Jan. 30, 2024

(54) PLASMA PROCESSING APPARATUS

(71) Applicant: TOKYO ELECTRON LIMITED, Tokyo (JP)

(72) Inventors: Kazushi Kaneko, Yamanashi (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 138 days.

(21) Appl. No.: 17/513,711

(22) Filed: Oct. 28, 2021

(65) Prior Publication Data

US 2022/0130643 A1    Apr. 28, 2022

(30) Foreign Application Priority Data

Oct. 28, 2020   (JP) ................................. 2020-180598
Sep. 2, 2021    (JP) ................................. 2021-143191

(51) Int. Cl.
*H01J 37/32*    (2006.01)

(52) U.S. Cl.
CPC ... *H01J 37/32311* (2013.01); *H01J 37/32275* (2013.01)

(58) Field of Classification Search
CPC ........... H01J 37/32266; H01J 37/32275; H01J 37/32293; H01J 37/32311
See application file for complete search history.

(56) References Cited

U.S. PATENT DOCUMENTS

| 6,309,978 B1* | 10/2001 | Donohoe .......... H01J 37/32165 438/689 |
| 8,992,724 B2* | 3/2015 | Kanazawa ......... H01J 37/32311 156/345.47 |
| 2019/0148112 A1* | 5/2019 | Kaneko ............... H01J 37/3299 156/345.24 |
| 2021/0202276 A1* | 7/2021 | Song ................. H01L 21/67253 |

FOREIGN PATENT DOCUMENTS

| JP | 5320260 B2 | 10/2013 |
| JP | 2019-36482 A | 3/2019 |

* cited by examiner

*Primary Examiner* — Tung X Le
(74) *Attorney, Agent, or Firm* — XSENSUS LLP

(57) ABSTRACT

There is provided a plasma processing apparatus. The apparatus comprises: a chamber body; and a power supply unit configured to output power for exciting a gas supplied to an inside of the chamber body. The power supply unit supplies, as power having a center frequency, a bandwidth, and a carrier pitch respectively corresponding to a set frequency, a set bandwidth, and a set carrier pitch that are indicated by a controller, power which is pulse-modulated so as to be a pulse frequency, a duty ratio, a high level, and a low level respectively corresponding to a set pulse frequency, a set duty ratio, a high-level set power, and a low-level set power indicated by the controller, and in which a pulse on time determined by the set pulse frequency and the set duty ratio is longer than a power fluctuation cycle of the power having the bandwidth.

5 Claims, 23 Drawing Sheets

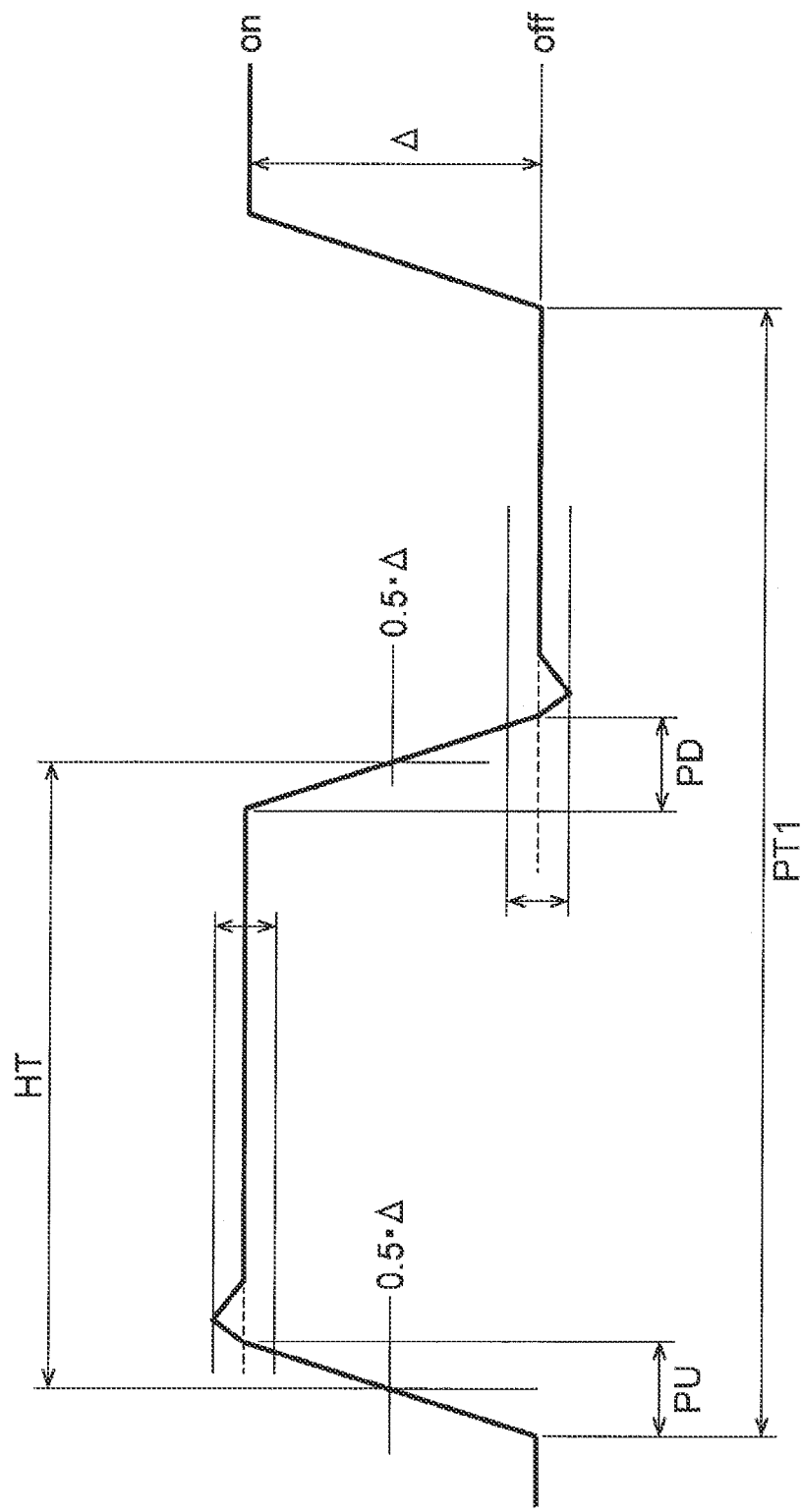

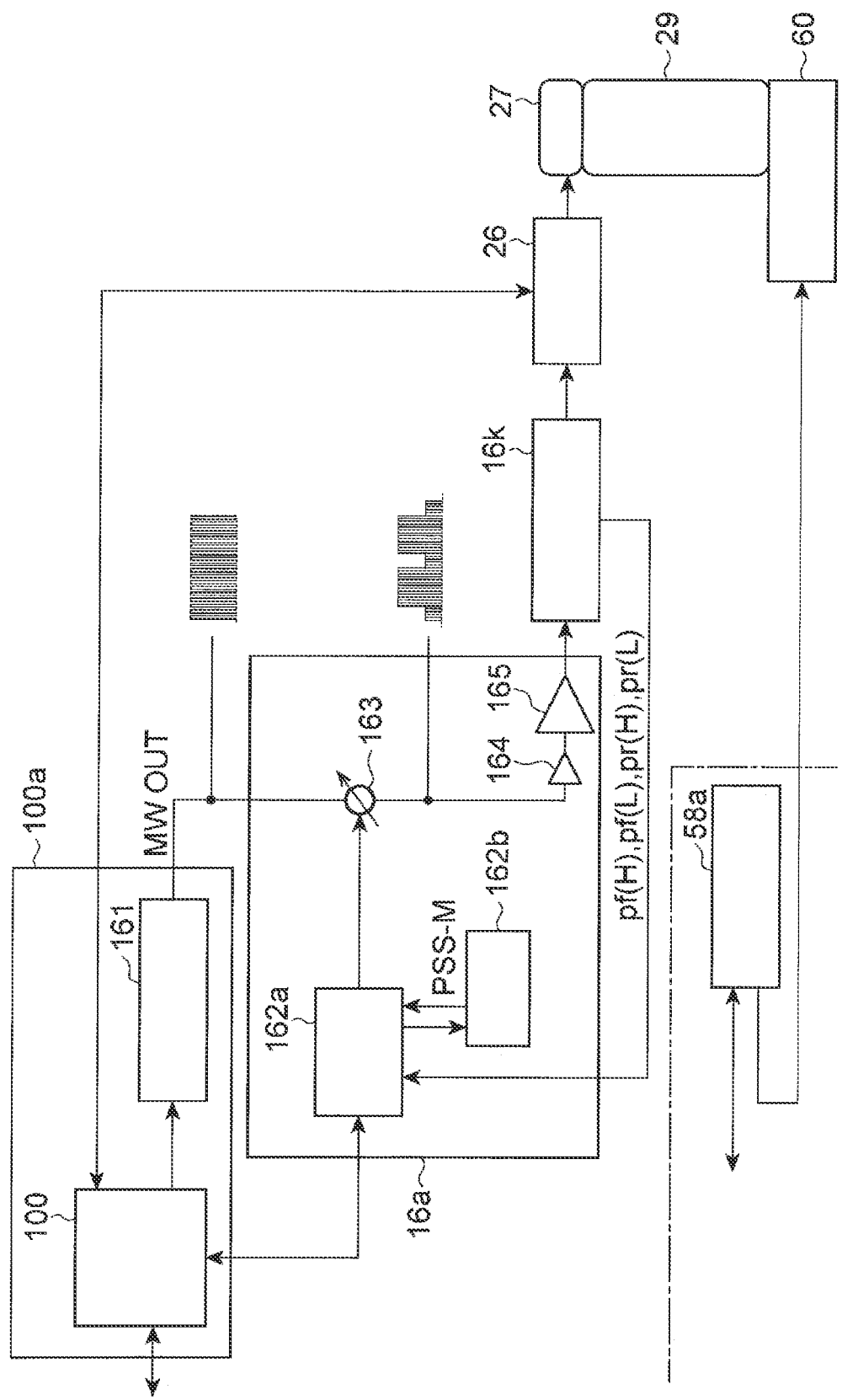

FIG. 15

| START TIMING [μs] | 0 | 10 | 20 | 30 | 40 | 50 | 60 | 70 | 80 | 90 |
|---|---|---|---|---|---|---|---|---|---|---|
| AVERAGE POWER [W] | 971 | 984 | 1,010 | 1,014 | 1,017 | 1,029 | 1,016 | 991 | 987 | 983 |
| STANDARD DEVIATION [W] | 70 | 76 | 75 | 79 | 72 | 53 | 56 | 60 | 54 | 60 |
| MAXIMUM POWER [W] | 1,103 | 1,103 | 1,103 | 1,103 | 1,103 | 1,097 | 1,097 | 1,097 | 1,087 | 1,087 |
| MINIMUM POWER [W] | 823 | 823 | 823 | 823 | 823 | 869 | 869 | 869 | 881 | 832 |

FIG.16

| FREQUENCY | DUTY RATIO | PULSE CYCLE | PULSE ON TIME |
|---|---|---|---|
| 1kHz | 10% | 1,000μs | 100μs |
| 1kHz | 90% | 1,000μs | 900μs |
| 5kHz | 10% | 200μs | 20μs |
| 5kHz | 90% | 200μs | 180μs |
| 10kHz | 10% | 100μs | 10μs |
| 10kHz | 90% | 100μs | 90μs |
| 15kHz | 10% | 66.6μs | 6.66μs |
| 15kHz | 90% | 66.6μs | 59.94μs |
| 20kHz | 10% | 50μs | 5μs |
| 20kHz | 90% | 50μs | 45μs |
| 50kHz | 10% | 20μs | 2μs |
| 50kHz | 90% | 20μs | 18μs |

FIG.17

| BB WIDTH | CARRIER PITCH | NUMBER OF CARRIERS | BB CYCLE | CORRESPONDING PULSE ON TIME |
|---|---|---|---|---|
| SP | ... | 1 | ... | |
| 10MHz | 10kHz | 1001 | 100μs | ... |
| 10.1MHz | 10.1kHz | 1001 | 99.0099μs | 100μs |
| 10.01MHz | 100.1kHz | 101 | 9.999μs | 10μs |
| 10.005MHz | 200.1kHz | 51 | 4.9975μs | 5μs |
| 1.0002MHz | 500.1kHz | 3 | 1.9996μs | 2μs |
| 2.5005MHz | 500.1kHz | 6 | 1.9996μs | 2μs |
| 5.001MHz | 500.1kHz | 11 | 1.9996μs | 2μs |
| 10.002MHz | 500.1kHz | 21 | 1.9996μs | 2μs |
| 20.004MHz | 500.1kHz | 41 | 1.9996μs | 2μs |
| 50.01MHz | 500.1kHz | 101 | 1.9996μs | 2μs |
| 95.5199MHz | 500.1kHz | 200 | 1.9996μs | 2μs |

FIG. 19

| START TIMING [μs] | 0 | 10 | 20 | 30 | 40 | 50 | 60 | 70 | 80 | 90 |
|---|---|---|---|---|---|---|---|---|---|---|
| AVERAGE POWER [W] | 1,000 | 1,000 | 1,000 | 1,000 | 1,000 | 1,000 | 1,000 | 1,000 | 1,000 | 1,000 |
| STANDARD DEVIATION [W] | 68 | 68 | 68 | 68 | 68 | 68 | 68 | 68 | 68 | 68 |
| MAXIMUM POWER [W] | 1,103 | 1,103 | 1,103 | 1,103 | 1,103 | 1,103 | 1,103 | 1,103 | 1,103 | 1,103 |
| MINIMUM POWER [W] | 823 | 823 | 823 | 823 | 823 | 823 | 823 | 823 | 823 | 823 |

PLASMA PROCESSING APPARATUS

CROSS-REFERENCE TO RELATED APPLICATIONS

This application claims priority to Japanese Patent Application Nos. 2020-180598 filed on Oct. 28, 2020 and 2021-143191 filed on Sep. 2, 2021, respectively, the entire contents of which are incorporated herein by reference.

TECHNICAL FIELD

The present disclosure relates to a plasma processing apparatus.

BACKGROUND

Japanese Patent Application Publication No. 2019-36482 discloses a plasma processing apparatus using a microwave. The plasma processing apparatus includes a microwave output device that outputs a microwave having a bandwidth. The microwave output device controls power of a pulse-modulated microwave.

SUMMARY

The apparatus disclosed in Patent Document 1 has room for improvement in order to precisely control pulse-modulated power (an example of power) of a microwave having a bandwidth for a multi-carrier. The present disclosure provides a plasma processing apparatus capable of precisely controlling pulse-modulated power of a microwave having a bandwidth for a multi-carrier.

In accordance with an aspect of the present disclosure, there is provided a plasma processing apparatus. The apparatus comprises: a chamber body; and a power supply unit configured to output power for exciting a gas supplied to an inside of the chamber body. The power supply unit supplies, as power having a center frequency, a bandwidth, and a carrier pitch respectively corresponding to a set frequency, a set bandwidth, and a set carrier pitch that are indicated by a controller, power which is pulse-modulated so as to be a pulse frequency, a duty ratio, a high level, and a low level respectively corresponding to a set pulse frequency, a set duty ratio, a high-level set power, and a low-level set power indicated by the controller, and in which a pulse on time determined by the set pulse frequency and the set duty ratio is longer than a power fluctuation cycle of the power having the bandwidth.

BRIEF DESCRIPTION OF THE DRAWINGS

FIG. 6 is an example of a synchronization signal for pulse-modulating a microwave.

FIG. 7 is an example of a configuration related to power feedback of a microwave.

FIG. 15 is a table summarizing the measurement results of the power of the microwave (carrier pitch of 10 kHz, with a pulse modulation) having the bandwidth for the multi-carrier.

FIG. 16 is a table showing an example of a pulse on time.

FIG. 17 is a table showing an example of a carrier pitch, a BB cycle, and a pulse on time.

FIG. 19 is a table summarizing the measurement results of the power of the microwave (carrier pitch of 500.1 kHz, with the pulse modulation) having the bandwidth for the multi-carrier.

DETAILED DESCRIPTION

Figure 1:
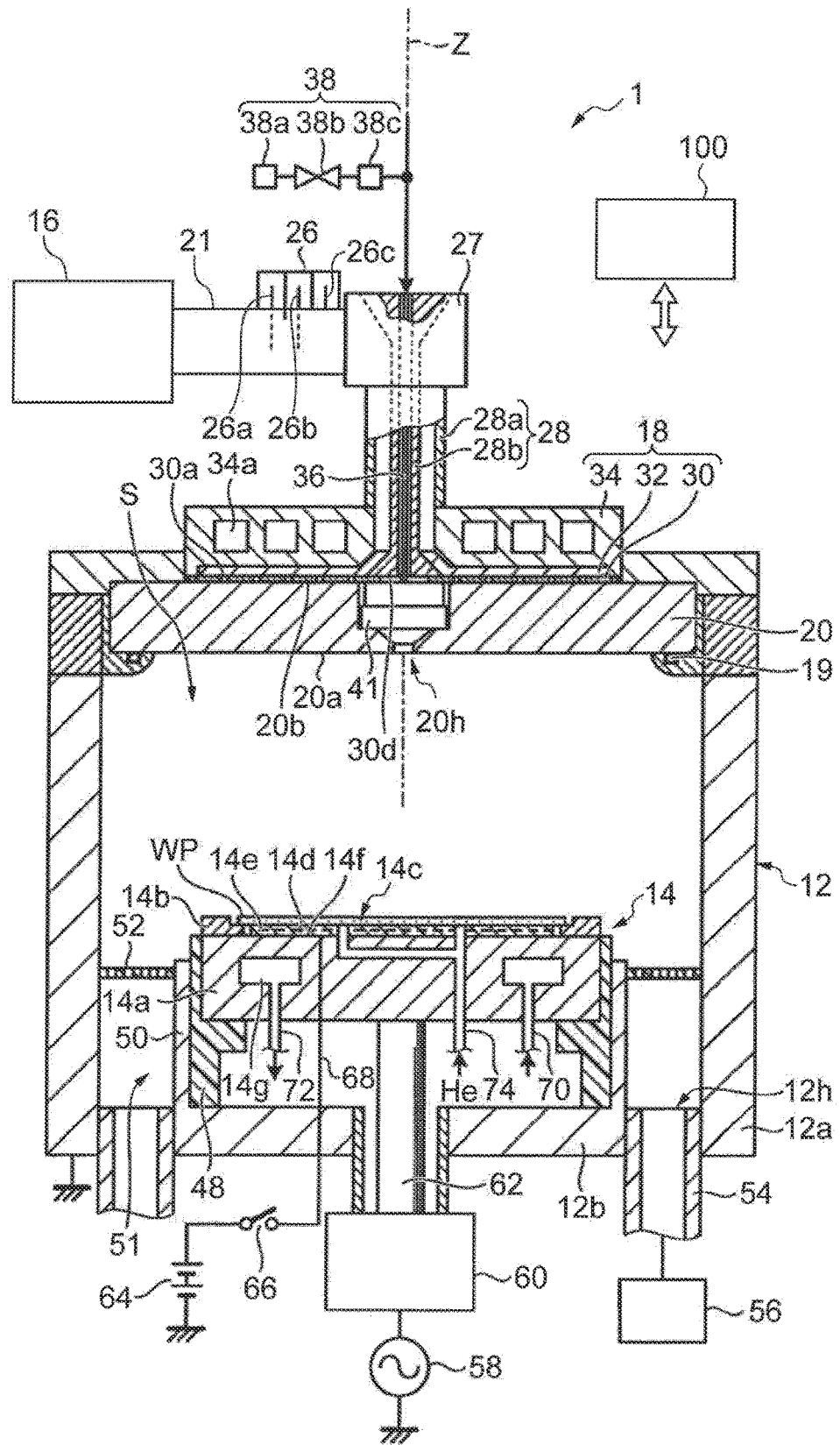
FIG. 1 is a diagram illustrating an example of a plasma processing apparatus according to an embodiment.

Hereinafter, various exemplary embodiments will be described.

In one aspect, a plasma processing apparatus is provided. The plasma processing apparatus includes a chamber body and a microwave output device that outputs a microwave for exciting gas supplied to the inside of the chamber body. The microwave output device includes a microwave generation unit, an output unit, a first directional coupler, and a measurement unit. The microwave generation unit generates, as a microwave having a center frequency and a bandwidth corresponding to a set frequency, a set bandwidth, and a set carrier pitch that are indicated by a controller, the microwave whose power is pulse-modulated so as to be a pulse frequency, a duty ratio, a high level and a low level respectively corresponding to a set pulse frequency, a set duty ratio, a high-level set power, and a low-level set power that are indicated by the controller. In addition, the duty ratio is a value obtained by dividing a pulse on time by a pulse cycle (pulse on time+pulse off time). The output unit outputs a microwave propagated from the microwave generation unit. The first directional coupler outputs a part of a traveling wave propagated from the microwave generation unit to the output unit. The measurement unit determines, based on a part of the traveling wave output from the first directional coupler, a first high measurement value and a first low measurement value respectively indicating a high level and a low level of the power of the traveling wave in the output unit. The pulse on time determined by the set pulse frequency and the set duty ratio is longer than a power fluctuation cycle of a microwave having a bandwidth. The microwave generation unit averages the first high measurement value and the first low measurement value at a predetermined moving average time and a predetermined sampling interval. The microwave generation unit controls the high-level power of the pulse-modulated microwave based on the averaged first high measurement value and the high-level set power, and controls the low-level power of the pulse-modulated microwave based on the averaged first low measurement value and the low-level set power.

In the plasma processing apparatus, the power of the microwave having the bandwidth for a multi-carrier is pulse-modulated. Then, the high-level power of the pulse-modulated microwave is controlled based on the averaged first high measurement value and the high-level set power. In addition, the high-level power of the pulse-modulated microwave is controlled based on the averaged first low measurement value and the low-level set power. In this way, by pulse-modulating the power of the microwave and controlling the high-level and low-level power based on the set power, it is possible to control the pulse-modulated power of the microwave having the bandwidth for the multi-carrier. Then, by satisfying the condition that the pulse on time determined by the set pulse frequency and the set duty ratio is longer than the power fluctuation cycle of the microwave having the bandwidth, the waveform of the high-level power can be cut out and averaged appropriately. For this reason, as a result, fluctuations (differences from the set power) in power are suppressed. Therefore, the apparatus can precisely control the power of the pulse-modulated microwave having the bandwidth.

In one embodiment, the microwave output device may further include a second directional coupler that outputs a part of a reflected wave returning to the output unit. The measurement unit further determines, based on a part of the reflected wave output from the second directional coupler, a second high measurement value and a second low measurement value respectively indicating a high level and a low level of the power of the reflected wave in the output unit. The microwave generation unit averages the second high measurement value and the second low measurement value at a predetermined moving average time and a predetermined sampling interval, controls the high-level power of the pulse-modulated microwave based on the averaged first high measurement value, the averaged second high measurement value, and the high-level set power, and controls the low-level power of the pulse-modulated microwave based on the averaged first low measurement value, the averaged second low measurement value, and low-level set power.

By the configuration, the plasma processing apparatus can control the power based on the power of the reflected wave. In addition, the plasma processing apparatus can cut out the waveform of the high-level power and average the cut-out waveforms appropriately, even for the power of the reflected wave.

In an embodiment, the pulse low time determined by the set pulse frequency and the set duty ratio may be longer than the power fluctuation cycle of the microwave with the bandwidth.

In an embodiment, the low level may be 0. In this case, the plasma processing apparatus can cut out the waveform of the on/off-controlled power and average the cut-out waveforms appropriately.

Hereinafter, various embodiments will be described in detail with reference to the accompanying drawings. In each drawing, the same or equivalent parts are denoted by the same reference numerals.

[Plasma Processing Apparatus]

FIG. 1 is a diagram illustrating a plasma processing apparatus according to an embodiment. As illustrated in FIG. 1, the plasma processing apparatus 1 includes a chamber body 12, and a microwave output device 16. The plasma processing apparatus 1 may further include a stage 14, an antenna 18, and a dielectric window 20.

The chamber body 12 has a processing space S provided therein. The chamber body 12 has a side wall 12a and a bottom portion 12b. The side wall 12a is formed in a substantially cylindrical shape. A central axis of the side wall 12a substantially matches an axis Z extending in a vertical direction. The bottom portion 12b is provided on a lower end side of the side wall 12a. An exhaust hole 12h for exhaust is provided in the bottom portion 12b. Further, an upper end portion of the side wall 12a is an opening.

The dielectric window 20 is provided on the upper end portion of the side wall 12a. The dielectric window 20 has a lower surface 20a facing the processing space S. The dielectric window 20 closes the opening of the upper end portion of the side wall 12a. An O-ring 19 is interposed between the dielectric window 20 and the upper end portion of the side wall 12a. By the O-ring 19, the chamber body 12 is sealed more reliably.

The stage 14 is accommodated in the processing space S. The stage 14 is provided so as to face the dielectric window 20 in the vertical direction. In addition, the stage 14 is provided so that the processing space S is interposed between the dielectric window 20 and the stage 14. This stage 14 is configured to support a workpiece WP (for example, a wafer) mounted thereon.

In an embodiment, the stage 14 includes a base 14a and an electrostatic chuck 14c. The base 14a has a substantially disk shape and is formed of a conductive material such as aluminum. A central axis of the base 14a substantially matches the axis Z. This base 14a is supported by a cylindrical support part 48. The cylindrical support part 48 is formed of an insulating material and extends vertically upward from the bottom portion 12b. A conductive cylindrical support part 50 is provided on an outer periphery of the cylindrical support part 48. The cylindrical support part 50 extends vertically upward from the bottom portion 12b of the chamber body 12 along the outer periphery of the cylindrical support part 48. An annular exhaust passage 51 is formed between the cylindrical support part 50 and the side wall 12a.

A baffle plate 52 is provided above the exhaust passage 51. The baffle plate 52 has an annular shape. The baffle plate 52 is provided with a plurality of through holes passing through the baffle plate 52 in a plate thickness direction. The exhaust hole 12h described above is provided below the baffle plate 52. An exhaust device 56 is connected to the exhaust hole 12h via an exhaust pipe 54. The exhaust device 56 has an automatic pressure control (APC) valve and a vacuum pump such as a turbo molecular pump. With this exhaust device 56, a degree of vacuum of the processing space S can be reduced to a desired degree of vacuum.

The base 14a also serves as a high-frequency electrode. A high-frequency power supply 58 for high-frequency bias is electrically connected to the base 14a via a power feeding rod 62 and a matching unit 60. The high-frequency power supply 58 outputs a high frequency of predetermined frequency, for example, 13.56 MHz suitable for controlling energy of ions applied to the workpiece WP with a set power.

In addition, the high-frequency power supply 58 may have a pulse generator, and pulse-modulate high-frequency power (radio frequency (RF) power), and apply the pulse-modulated high-frequency power to the base 14a. In this case, the high-frequency power supply 58 pulse-modulates the high-level power and the low-level power to become the periodically repeated high-frequency power. The high-frequency power supply 58 performs pulse adjustment based on a synchronization signal PSS-R generated by the pulse generator. The synchronization signal PSS-R is a signal for determining the cycle and duty ratio of the high-frequency power. As an example of the setting at the time of pulse modulation, the pulse frequency is 10 Hz to 250 kHz, and the duty ratio (ratio of the high-level power time to the pulse cycle) of the pulse is 10% to 90%.

The matching unit 60 accommodates a matching device for matching between impedance on the high-frequency power supply 58 side and impedance on a load side, such as an electrode, plasma, and the chamber body 12. A blocking capacitor for self-bias generation is included in this matching device. The matching unit 60 operates to obtain the matching based on the synchronization signal PSS-R when the high-frequency power is pulse-modulated.

The electrostatic chuck 14c is provided on an upper surface of the base 14a. The electrostatic chuck 14c holds the workpiece WP by electrostatic adsorption power. The electrostatic chuck 14c includes an electrode 14d, an insulating film 14e, and an insulating film 14f, and generally has a disk shape. A central axis of the base 14a substantially matches the axis Z. The electrode 14d of the electrostatic chuck 14c includes a conductive film and is provided between the insulating film 14e and the insulating film 14f. A direct current (DC) power supply 64 is electrically connected to the electrode 14d via a switch 66 and a covered wire 68. The electrostatic chuck 14c can adsorb and hold the workpiece WP by Coulomb power generated by a DC voltage applied from the DC power supply 64. Further, a focus ring 14b is provided on the base 14a. The focus ring 14b is disposed to surround the workpiece WP and the electrostatic chuck 14c.

A refrigerant chamber 14g is provided inside the base 14a. The refrigerant chamber 14g is formed so as to extend about the axis Z, for example. A coolant from a chiller unit is supplied to the refrigerant chamber 14g through a pipe 70. The coolant supplied to the refrigerant chamber 14g returns to the chiller unit through a pipe 72. By controlling a temperature of the coolant by the chiller unit, a temperature of the electrostatic chuck 14c and, furthermore, a temperature of the workpiece WP is controlled.

In addition, a gas supply line 74 is formed in the stage 14. The gas supply line 74 is provided to supply a heat transfer gas, for example, He gas, between an upper surface of the electrostatic chuck 14c and a rear surface of the workpiece WP.

The microwave output device 16 outputs a microwave for exciting a processing gas supplied to the inside of the chamber body 12. The microwave output device 16 is configured to variably adjust a frequency, power, and a bandwidth of the microwave. The microwave output device 16 can generate microwaves of a single frequency by, for example, setting the bandwidth of the microwave to approximately 0. In addition, the microwave output device 16 can generate a microwave having a bandwidth having a plurality of frequency components among these microwaves. The power of the plurality of frequency components may be the same, or only a center frequency component within a band may have power greater than that of other frequency components. In one example, the microwave output device 16 can adjust the power of the microwave within the range of 0W to 5000 W. The microwave output device 16 can adjust the microwave frequency or the center frequency within the range of 2400 MHz to 2500 MHz. The microwave output device 16 can adjust the microwave bandwidth in the range of 0 MHz to 100 MHz. In addition, the microwave output device 16 can adjust frequency pitches (carrier pitches) of a plurality of frequency components of a microwave in a band within the range of 0 to 1 MHz.

The microwave output device 16 may have a pulse generator, and pulse-modulate and output power of a microwave. In this case, the microwave output device 16 pulse-modulates the microwave so that high-level power and low-level power are periodically repeated power. The microwave output device 16 adjusts a pulse based on a synchronization signal PSS-M generated by the pulse generator. The synchronization signal PSS-M is a signal for determining a cycle and a duty ratio of the power of the microwave. As an example of the setting at the time of pulse modulation, the pulse frequency is 1 Hz to 20 kHz, and the duty ratio (ratio of the high-level power time to the pulse cycle) of the pulse is 10% to 90%. The microwave output device 16 may pulse-modulate the power of the microwave output by the high-frequency power supply 58 so as to synchronize with the pulse-modulated high-frequency power.

The plasma processing apparatus 1 further includes a waveguide 21, a tuner 26, a mode converter 27, and a coaxial waveguide 28. The output unit of the microwave output device 16 is connected to one end of the waveguide 21. The other end of the waveguide 21 is connected to the mode converter 27. The waveguide 21 is, for example, a rectangular waveguide. The waveguide 21 is provided with a tuner 26. The tuner 26 has stubs 26a, 26b, and 26c. Each of the stubs 26a, 26b, and 26c is configured such that the amount of protrusion from an internal space of the waveguide 21 can be adjusted. By adjusting the respective protruding positions of the stubs 26a, 26b, and 26c with respect to a reference position, the tuner 26 matches the impedance of the microwave output device 16 and the load, for example, the impedance of the chamber body 12.

The mode converter 27 converts a mode of the microwave from the waveguide 21 and supplies the mode-converted microwave to the coaxial waveguide 28. The coaxial waveguide 28 includes an outer conductor 28a and an inner conductor 28b. The outer conductor 28a has a substantially cylindrical shape, and its central axis substantially matches the axis Z. The inner conductor 28b has a substantially cylindrical shape and extends inside the outer conductor 28a. The central axis of the inner conductor 28b substantially matches the axis Z. This coaxial waveguide 28 transmits the microwave from the mode converter 27 to the antenna 18.

The antenna 18 is provided on a surface 20b opposite to a lower surface 20a of the dielectric window 20. The antenna 18 includes a slot plate 30, a dielectric plate 32, and a cooling jacket 34.

The slot plate 30 is provided on the surface 20b of the dielectric window 20. This slot plate 30 is formed of a metal having conductivity and has a substantially disk shape. A central axis of the slot plate 30 substantially matches the axis Z. A plurality of slot holes 30a are formed in the slot plate 30. In an example, the plurality of slot holes 30a include a plurality of slot pairs. Each of the plurality of slot pairs includes two slot holes 30a in a shape of substantially long holes extending in directions intersecting with each other. The plurality of slot pairs are arranged along one or more concentric circles around the axis Z. In addition, in the central portion of the slot plate 30, a through hole 30d through which a conduit 36 to be described later can pass is formed.

The dielectric plate 32 is provided on the slot plate 30. The dielectric plate 32 is formed of a dielectric material such as quartz and has a substantially disk shape. The central axis of the dielectric plate 32 substantially matches the axis Z. The cooling jacket 34 is provided on the dielectric plate 32. The dielectric plate 32 is provided between the cooling jacket 34 and the slot plate 30.

A surface of the cooling jacket 34 has conductivity. A flow path 34a is formed inside the cooling jacket 34. The flow path 34a is configured to supply a coolant. A lower end of the outer conductor 28a is electrically connected to an upper surface of the cooling jacket 34. Further, the lower end of the inner conductor 28b is electrically connected to the slot plate 30 through a hole formed in a central portion of the cooling jacket 34 and the dielectric plate 32.

The microwaves passing through the coaxial waveguide 28 propagate through the dielectric plate 32 and are supplied to the dielectric window 20 from the plurality of slot holes 30a of the slot plate 30. The microwave supplied to the dielectric window 20 is introduced into the processing space S.

The conduit 36 passes through the inner hole of the inner conductor 28b of the coaxial waveguide 28. In addition, as described above, the through hole 30d through which the conduit 36 passes is formed in the central portion of the slot plate 30. The conduit 36 extends through the inner hole of the inner conductor 28b and is connected to a gas supply system 38.

The gas supply system 38 supplies the processing gas for processing the workpiece WP to the conduit 36. The gas supply system 38 may include a gas source 38a, a valve 38b, and a flow rate controller 38c. The gas source 38a is a gas source for a processing gas. The valve 38b switches the supply of the processing gas from the gas source 38a and the supply stop. The flow rate controller 38c is, for example, a mass flow controller, and adjusts the flow rate of the processing gas from the gas source 38a.

The plasma processing apparatus 1 may further include an injector 41. The injector 41 supplies a gas from the conduit 36 to the through hole 20h formed in the dielectric window 20. The gas supplied to the through hole 20h of the dielectric window 20 is supplied to the processing space S. Then, the processing gas is excited by the microwaves introduced into the processing space S from the dielectric window 20. Thereby, the plasma is generated in the processing space S, and the workpiece WP is treated by active species such as ions and/or radicals from the plasma.

The plasma processing apparatus 1 may further include a controller 100. The controller 100 integrally controls each unit of the plasma processing apparatus 1. The controller 100 may include a processor such as a central processing unit (CPU), a user interface, and a storage unit.

The processor integrally controls each unit such as the microwave output device 16, the stage 14, the gas supply system 38, and the exhaust device 56 by executing a program and a process recipe stored in the storage unit.

In order for a process manager to manage the plasma processing apparatus 1, a user interface may include a keyboard or a touch panel for performing an input operation or the like of a command, a display for visualizing and displaying an operation status of the plasma processing apparatus 1, or the like.

The storage unit stores a control program (software) for realizing various processes executed by the plasma processing apparatus 1 under the control of the processor, the process recipe including processing condition data, and the like. The processor calls and executes various control programs from the storage unit as necessary, such as an instruction from the user interface. Under the control of such a processor, desired processing is performed in the plasma processing apparatus 1.

Configuration Example of Microwave Output Device 16

Figure 2:
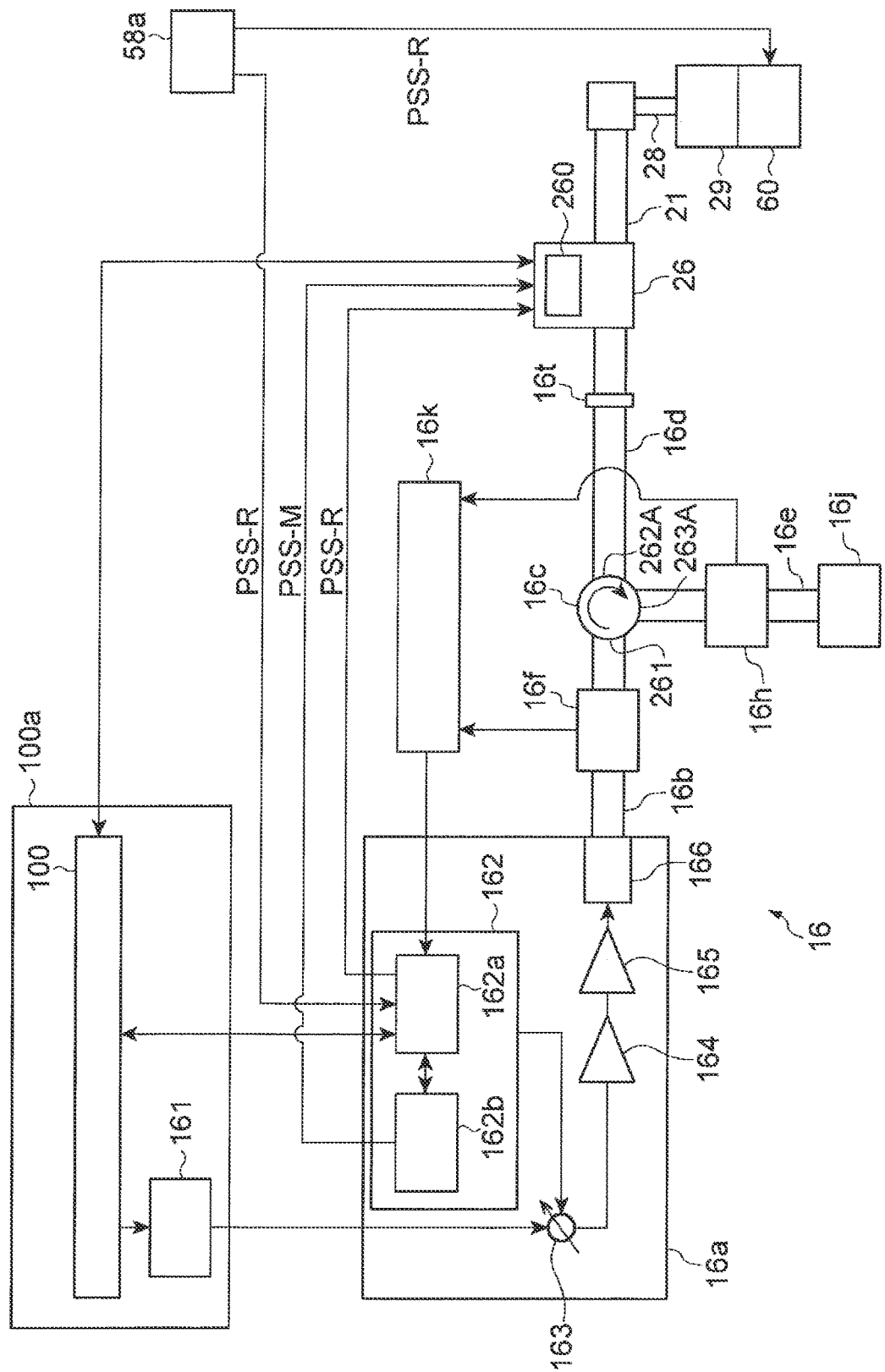
FIG. 2 is a diagram illustrating an example of a microwave output device.

FIG. 2 is a diagram illustrating an example of the microwave output device. As illustrated in FIG. 2, the microwave output device 16 is connected to an arithmetic device 100a having a controller 100 and a waveform generator 161.

The waveform generator 161 generates a waveform of a microwave. The waveform generator 161 generates a waveform of a microwave having a center frequency and a bandwidth respectively corresponding to a set frequency and a set bandwidth specified by the controller 100. The waveform generator 161 outputs the waveform of the microwave to the microwave output device 16.

The microwave output device 16 pulse-modulates the microwave waveform generated by the waveform generator 161 according to the setting of the controller 100, and outputs the pulse-modulated microwave as the microwave. The microwave output device 16 has a microwave generation unit 16a, a waveguide 16b, a circulator 16c, a waveguide 16d, a waveguide 16e, a first directional coupler 16f, a second directional coupler 16h, a measurement unit 16k (an example of a measurement unit), and a dummy rod 16j.

The microwave generation unit 16a generates a microwave whose power is pulse-modulated so as to have a pulse frequency, a duty ratio, a high level, and a low level according to a set value indicated by the controller 100. The set value includes a pulse frequency, a set duty ratio, and high-level set power and low-level set power.

The microwave generation unit 16a includes a power control unit 162, an attenuator 163, an amplifier 164, an amplifier 165, and a mode converter 166.

The waveform generator 161 is connected to the attenuator 163. The attenuator 163 is, as an example, a device capable of changing an attenuation amount (attenuation rate) according to an applied voltage value. The power control unit 162 is connected to the attenuator 163. The power control unit 162 controls the attenuation rate (attenuation amount) of the microwave in the attenuator 163 based on the applied voltage value. The power control unit 162 controls the attenuation rate (attenuation amount) of the microwave in the attenuator 163 so that the microwave output by the waveform generator 161 becomes a microwave of power according to the set value. The set value includes the pulse frequency, the set duty ratio, and the high-level set power and low-level set power that are indicated by the controller 100.

The power control unit 162 includes, as an example, a control unit 162a and a pulse generator 162b. The control unit 162a may be a processor. The control unit 162a acquires a setting profile from the controller 100. The control unit 162*a* outputs information (pulse frequency and duty ratio) necessary for pulse modulation in the setting profile to the pulse generator 162*b*. The pulse generator 162*b* generates the synchronization signal PSS-M based on the acquired information. The control unit 162*a* determines the attenuation rate (attenuation amount) of the microwave based on the synchronization signal PSS-M and the setting profile set by the controller 100.

The control unit 162*a* may acquire the synchronization signal PSS-R generated from the pulse generator 58*a* of the high-frequency power supply 58. The pulse generator 162*b* may generate the synchronization signal PSS-M synchronized with the synchronization signal PSS-R. In this case, the pulse modulation of the power of the microwave and the pulse modulation of the high frequency power can be synchronized.

An output of the attenuator 163 is connected to a mode converter 166 via an amplifier 164 and an amplifier 165. The amplifier 164 and the amplifier 165 amplify a microwave at a predetermined amplification rate, respectively. The mode converter 166 converts a propagation mode of the microwave output from the amplifier 165 from TEM to TE01. The microwave generated by the mode conversion in this mode converter 166 is output as an output microwave of the microwave generation unit 16*a*.

The output of the microwave generation unit 16*a* is connected to one end of the waveguide 16*b*. The other end of the waveguide 16*b* is connected to a first port 261 of the circulator 16*c*. The circulator 16*c* has a first port 261, a second port 262A, and a third port 263A. The circulator 16*c* is configured to output a microwave input to the first port 261 from the second port 262A, and output a microwave input to the second port 262A from the third port 263A. One end of the waveguide 16*d* is connected to the second port 262A of the circulator 16*c*. The other end of the waveguide 16*d* is an output unit 16*t* of the microwave output device 16.

One end of the waveguide 16*e* is connected to the third port 263A of the circulator 16*c*. The other end of the waveguide 16*e* is connected to the dummy rod 16*j*. The dummy rod 16*j* receives a microwave propagating through the waveguide 16*e* and absorbs the microwave. The dummy rod 16*j* converts, for example, the microwave into heat.

The first directional coupler 16*f* is provided between one end and the other end of the waveguide 16*b*. The first directional coupler 16*f* is configured to branch a part of the microwave (that is, traveling wave) output from the microwave generation unit 16*a* and propagating to the output unit 16*t*, and output a part of the traveling wave.

The second directional coupler 16*h* is provided between one end and the other end of the waveguide 16*e*. The second directional coupler 16*h* is configured to branch a part of a reflected wave transmitted to the third port 263A of the circulator 16*c* with respect to the microwave (that is, reflected wave) returning to the output unit 16*t*, and output a part of the reflected wave.

The measurement unit 16*k* determines, based on a part of a traveling wave output from the first directional coupler 16*f*, a first high measurement value pf(H) and a first low measurement value pf(L) respectively indicating a high level and a low level of the power of the traveling wave in the output unit 16*t*. In addition, the measurement unit 16*k* determines, based on a part of a reflected wave output from the second directional coupler 16*h*, a second high measurement value pr(H) and a second low measurement value pr(L) respectively indicating a high level and a low level of the power of the reflected wave in the output unit 16*t*.

The measurement unit 16*k* is connected to the power control unit 162. The measurement unit 16*k* outputs the measurement value to the power control unit 162. The power control unit 162 controls the attenuator 163 so that a difference between the measurement values of the traveling wave and the reflected wave, that is, the load power (effective power) matches the set power specified by the controller 100 (power feedback control).

The tuner 26 includes a tuner control unit 260. The tuner control unit 260 adjusts protrusion positions of the stubs 26*a*, 26*b*, and 26*c* based on the signal of the controller 100 to match the impedance on the microwave output device 16 side with the impedance on the antenna 18 side. The tuner control unit 260 operates the stubs 26*a*, 26*b*, and 26*c* by a driver circuit and an actuator (not illustrated).

The tuner control unit 260 may acquire at least one of the synchronization signal PSS-M for the power of the microwave generated by the pulse generator 162*b*, and the synchronization signal PSS-R for the high-frequency power generated by the pulse generator 58*a* of the high-frequency power supply 58. For example, the tuner control unit 260 acquires the synchronization signal PSS-M from the control unit 162*a*. The tuner control unit 260 may acquire the synchronization signal PSS-R from the control unit 162*a* or directly from the pulse generator 58*a* of the high-frequency power supply 58. The tuner control unit 260 may operate the stubs 26*a*, 26*b*, and 26*c* in consideration of the synchronization signal.

[Details of Waveform Generation Unit]

Figure 3:
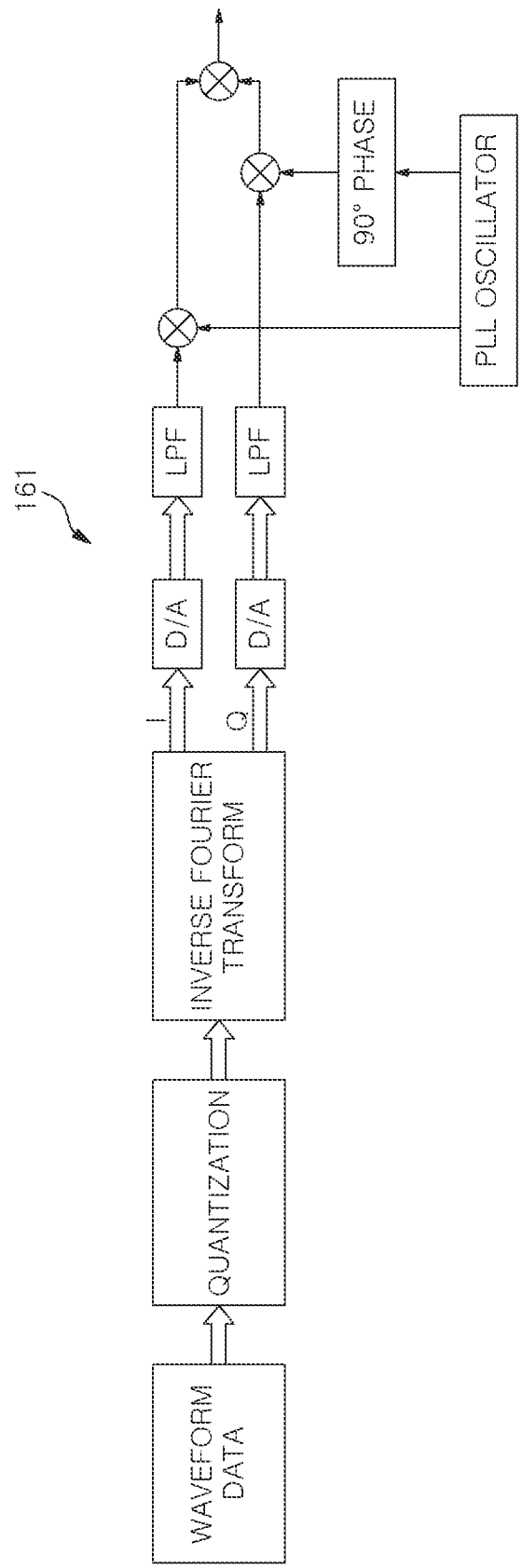
FIG. 3 is a diagram for describing a principle of generating a microwave in a waveform generation unit.

FIG. 3 is a diagram for describing a principle of generating a microwave in a waveform generation unit. As illustrated in FIG. 3, the waveform generator 161 includes, for example, a phase locked loop (PLL) oscillator capable of oscillating a microwave in which a reference frequency and a phase are synchronized, and an IQ digital modulator connected to the PLL oscillator. The waveform generator 161 sets the frequency of the microwave oscillated in the PLL oscillator to the set frequency specified by the controller 100. Then, the waveform generator 161 modulates a microwave from the PLL oscillator and a microwave having a phase difference of 90° from the microwave from the PLL oscillator by the IQ digital modulator. As a result, the waveform generator 161 generates a microwave having a plurality of frequency components or a microwave having a single frequency within a band.

The waveform generator 161 can generate the microwave having the plurality of frequency components by performing an inverse discrete Fourier transform on, for example, N complex data symbols to generate a continuous signal. The method of generating this signal may be the same as an orthogonal frequency-division multiple access (OFDMA) modulation method used in digital TV broadcasting or the like (see, for example, Japanese Patent No. 5320260).

In one example, the waveform generator 161 has waveform data represented by columns of codes digitized in advance. The waveform generator 161 quantizes the waveform data and applies an inverse Fourier transform to the quantized data to generate data I and data Q. Then, the waveform generator 161 applies digital/analog (D/A) conversion to each of the data I and the data Q to obtain two analog signals. The waveform generator 161 inputs these analog signals to a low pass filter (LPF) that passes only low frequency components. The waveform generator 161 mixes the two analog signals output from the LPF with the microwave from the PLL oscillator and the microwave having the phase difference of 90° from the microwave from the PLL oscillator, respectively. Then, the waveform generator 161 synthesizes the microwaves generated by the mixing. As a result, the waveform generator 161 generates microwaves having one or a plurality of frequency components.

Example of Microwave

Figure 4:
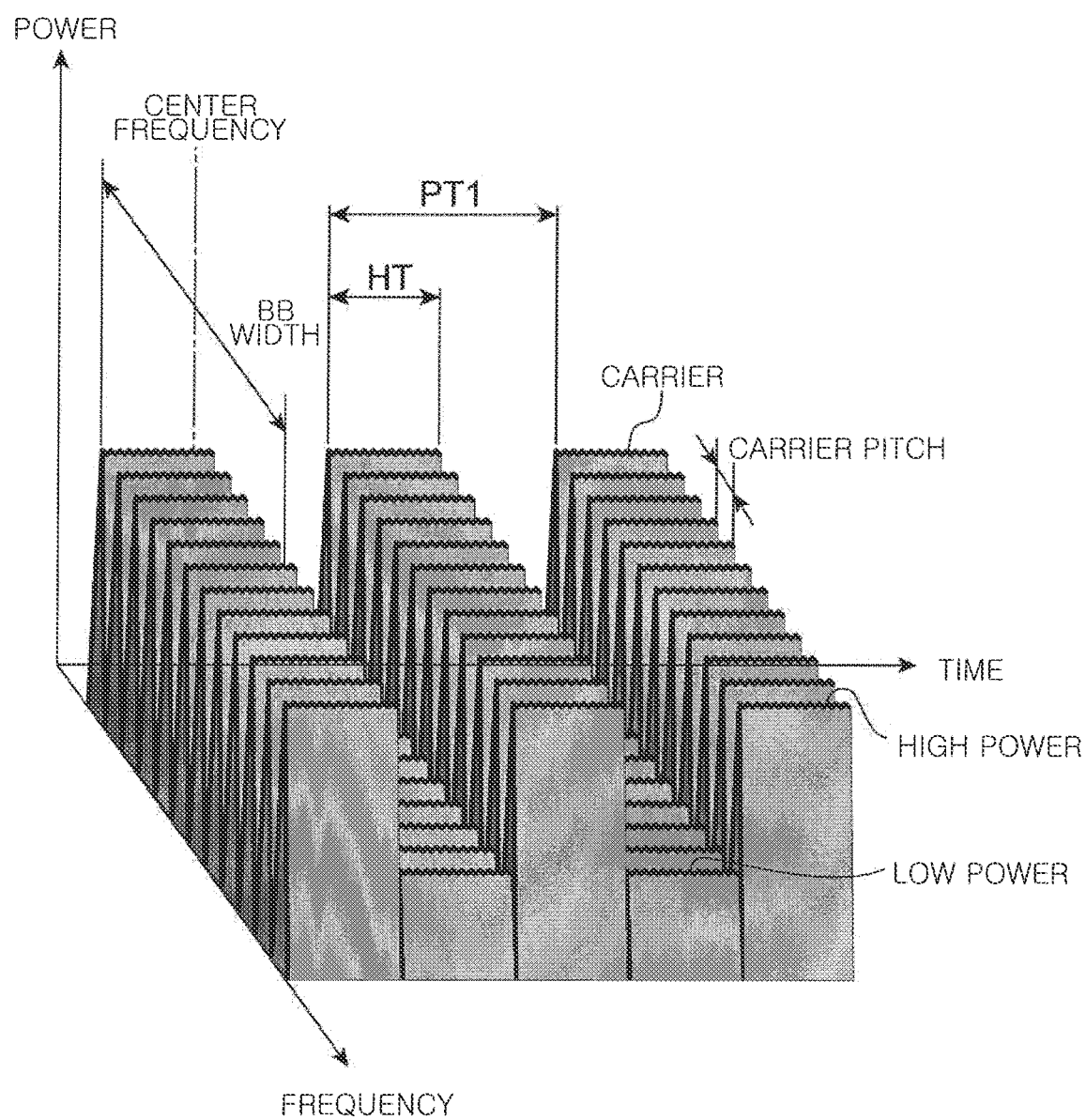
FIG. 4 is an example of a microwave whose power is pulse-modulated.

The power of the microwave output from the microwave generation unit 16a becomes a waveform modulated in a pulse shape so as to repeat high-level power and low-level power. FIG. 4 is an example of a microwave whose power is pulse-modulated. As illustrated in FIG. 4, the microwave has a center frequency, a bandwidth, and a carrier pitch respectively corresponding to a set frequency, a set bandwidth, and a set carrier pitch indicated by the controller 100. The microwave has a pulse frequency, a duty ratio, high-level power and low-level power according to a set value indicated by the controller 100. The set value includes the pulse frequency, the set duty ratio, and the high-level set power and low-level set power. The low-level power is lower than the high-level power. The low-level power may be a power higher than the lowest level required for maintaining the plasma generation state or may be set to zero. One waveform of the microwave is called a carrier. The carrier pitch is a carrier interval, and a reciprocal of the carrier pitch becomes the longest cycle among power fluctuation cycles of a microwave having a bandwidth.

Figure 5A:
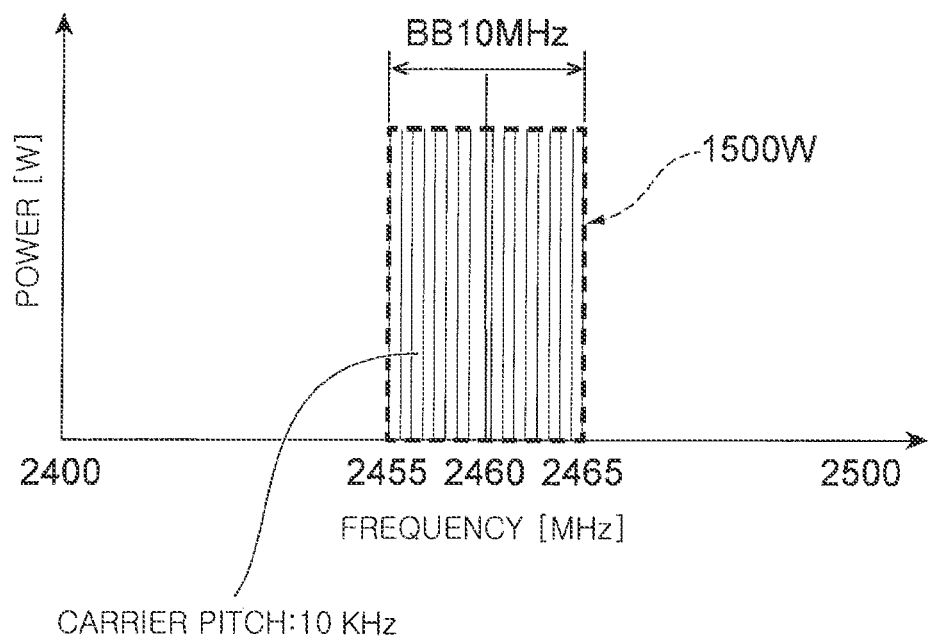
FIGS. 5A and 5B are diagrams illustrating an example of microwaves having different carrier pitches.
Figure 5B:
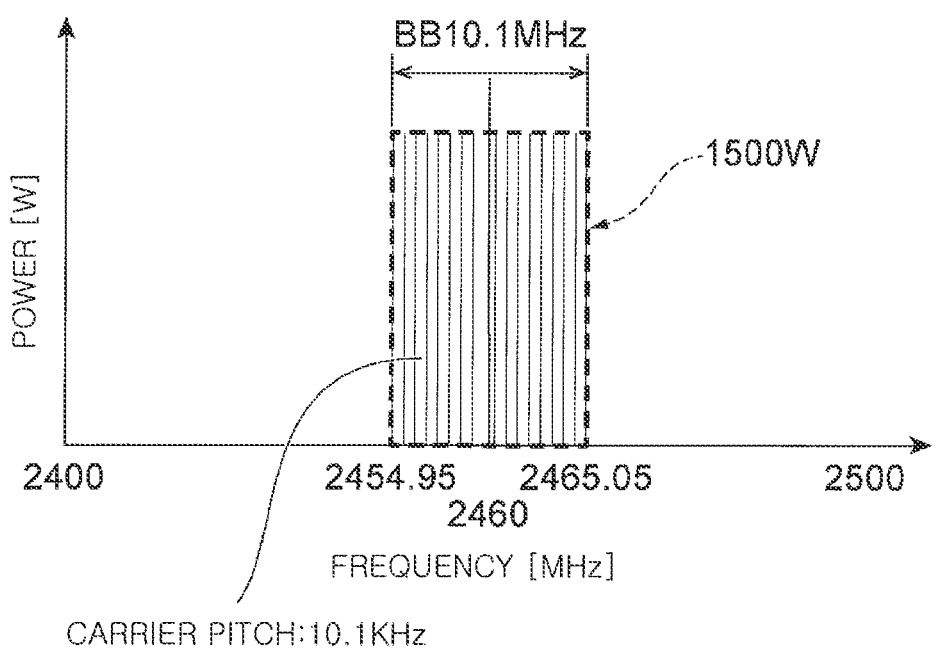

FIGS. 5A and 5B are examples of microwaves having different carrier pitches. FIG. 5A illustrates a microwave with a set frequency of 2460 MHz, a set bandwidth of 10 MHz, and a set carrier pitch of 10 kHz. The number of carriers can be obtained by dividing the set bandwidth by the set carrier pitch and adding 1. Here, the number of carriers is 1001. FIG. 5B illustrates a microwave with a set frequency of 2460 MHz, a set bandwidth of 10.1 MHz, and a set carrier pitch of 10.1 kHz. The number of carriers is 1001. As illustrated in FIGS. 5A and 5B, the power of any microwave is 1500 W. That is, even if the power is the same, the carrier pitch and the set bandwidth can be set to be different.

Example of Synchronization Signal of Microwave

FIG. 6 is an example of a synchronization signal for pulse-modulating a microwave. As illustrated in FIG. 6, the synchronization signal PSS-M is a pulse signal in which an on state (high state) and an off state (low state) appear alternately. A pulse cycle PT1 of the synchronization signal PSS-M is defined as a timing interval at which the high level is reached. When the difference between the high level and the low level is Δ, a high time HT is defined as a period from a timing at which it becomes 0.5Δ in a rising period PU of the pulse to a timing at which it becomes 0.5Δ in a falling period PD of the pulse. The ratio of the high time HT to the pulse cycle PT1 is a duty ratio. The pulse generator 162b generates the synchronization signal as illustrated in FIG. 6 based on a pulse frequency (1/PT1) and a duty ratio (HT/PT1×100[%]) specified by the controller 100.

Example of Power Feedback

FIG. 7 is a diagram illustrating an example of a configuration related to power feedback of a microwave. As illustrated in FIG. 7, the power feedback is realized by the measurement unit 16k, the control unit 162a, and the attenuator 163.

As illustrated in FIG. 7, the waveform generator 161 outputs the microwave having the bandwidth for the multi-carrier. The control unit 162a and the attenuator 163 pulse-modulate the microwave having the bandwidth. The microwave generation unit 16a outputs the pulse-modulated microwave. The measurement unit 16k measures the power of the traveling wave and the reflected wave of the microwave, and outputs the measured power to the control unit 162a. The control unit 162a performs the power feedback so that the difference between the power detection value of the traveling wave and the power detection value of the reflected wave becomes a set value. By this feedback loop, the set value specified by the controller 100 is realized.

Here, when the power of the microwave is pulse-modulated, it is necessary to individually feedback control the high-level power and the low-level power, except in the case where the low-level power is set to 0. That is, the measurement unit 16k measures the first high measurement value pf(H), the first low measurement value pf(L), the second high measurement value pr(H), and the second low measurement value pr(L), and outputs the measurement result to the control unit 162a. The control unit 162a switches the high-level power feedback and the low-level power feedback based on the synchronization signal PSS-M.

When the high-level power is fed back, the control unit 162a controls the high-level power of the pulse-modulated microwave based on the first high measurement value pf(H), the second high measurement value pr(H), and the high-level set power. When the low-level power is fed back, the control unit 162a controls the low-level power of the pulse-modulated microwave based on the first low measurement value pf(L), the second low measurement value pr(L), and the low-level set power.

More specifically, the control unit 162a controls the difference between the first high measurement value pf(H) and the second high measurement value pr(H) when the high-level power is fed back. The control unit 162a controls the high-level power of the microwave output from the microwave output device 16 so that the difference approaches the set high power specified by the controller 100. In addition, the control unit 162a controls the difference between the first low measurement value pf(L) and the second low measurement value pr(L) when the low-level power is fed back. The control unit 162a controls the low-level power of the microwave output from the microwave output device 16 so that the difference approaches the set high power specified by the controller 100. As a result, the load power of the microwave supplied to the load coupled to the output unit 16t approaches the set power. In addition, when the low-level power is set to 0, only the high-level power feedback may be performed.

[Conversion of Control Mode of Feedback]

The control unit 162a may change the calculation of the feedback according to the control mode. The control mode may be specified by the controller 100. For example, when the control mode indicated by the controller 100 is a PL mode, as described above, the control unit 162a controls the power of the microwave using the power difference between the traveling wave and the reflected wave. When the control mode indicated by the controller 100 is a Pf mode, the control unit 162a controls the power of the microwave using only the power of the traveling wave. As a more specific example, when the control mode indicated by the controller 100 is the Pf mode, the control unit 162a operates as follows. The control unit 162a controls the high-level power of the pulse-modulated microwave so that the first high measurement value pf(H) approaches the high-level set power. In addition, the control unit 162a controls the low-level power of the pulse-modulated microwave so that the first low measurement value pf(L) approaches the low-level set power.

[Relationship Between Synchronization Signal of Power of Microwave and High-Frequency Power]

Both the power of the microwave and the high-frequency power are pulse-controlled. In the configuration illustrated in FIG. 7, the synchronization signal PSS-R of the high frequency power is not input to the control unit 162a. In addition, the synchronization signal PSS-M of the microwave is not input to the high-frequency power supply 58. For this reason, the power of the microwave and the high-frequency power become asynchronous.

Figure 8:
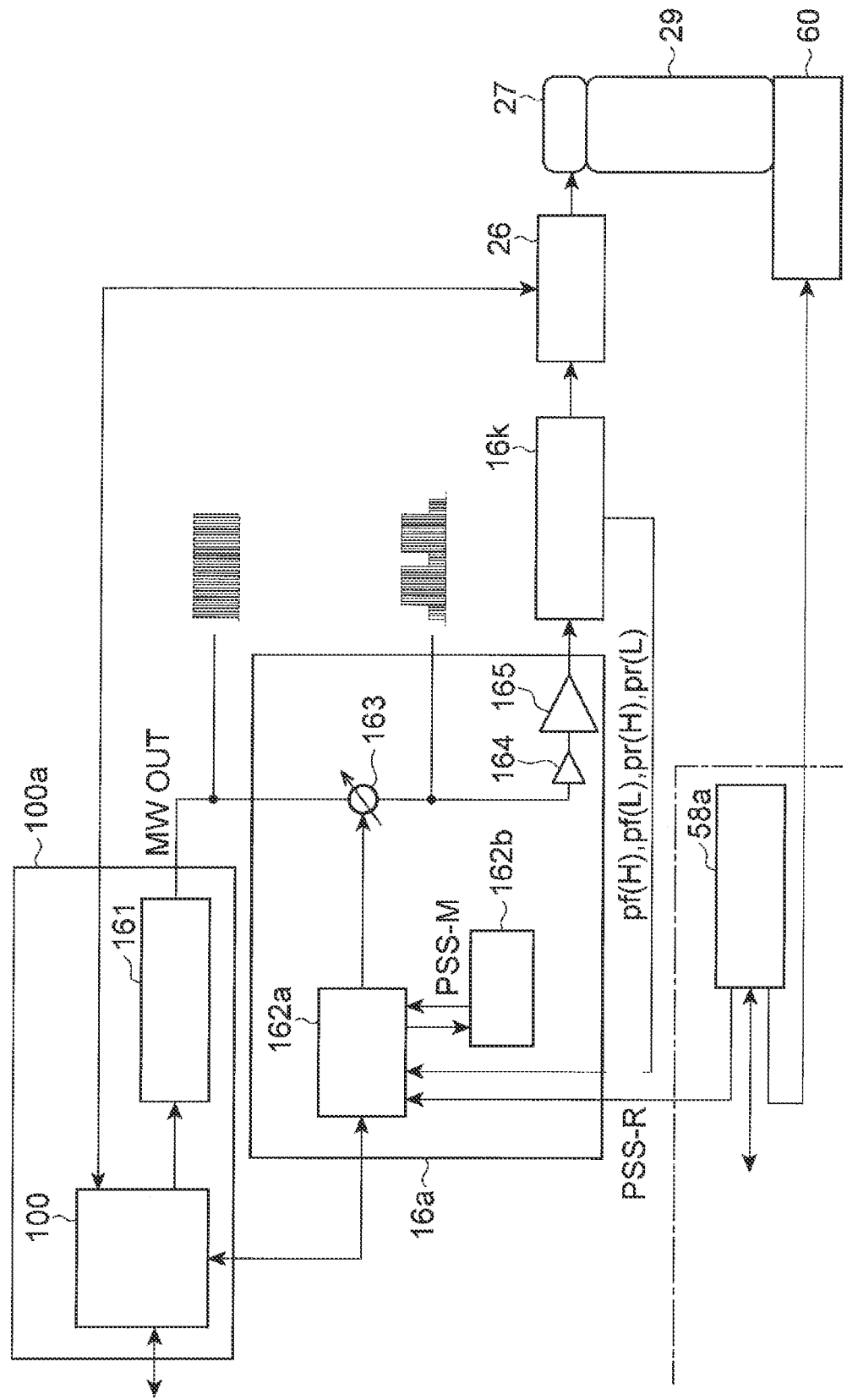
FIG. 8 is a diagram illustrating another example of a configuration related to the power feedback of the microwave.

In an embodiment, the power of the microwave and the high-frequency power may be synchronized. In this case, the influence of the pulse modulation of the high-frequency power on the reflected wave of the microwave can be reduced. FIG. 8 is a diagram illustrating another example of a configuration related to the power feedback of the microwave. Compared with the configuration of the asynchronous power feedback illustrated in FIG. 7, in another example, there is a difference in that the microwave output device generates a microwave whose power is pulse-modulated to synchronize with the high-frequency power, and the rest is the same. The pulse generator 58a of the high-frequency power supply 58 outputs the synchronization signal PSS-R of the high-frequency power to the control unit 162a. The control unit 162a outputs a synchronization trigger for synchronizing with the synchronization signal PSS-R to the pulse generator 162b. The pulse generator 162b generates the synchronization signal PSS-M of the power of the microwave synchronized with the synchronization signal PSS-R based on a synchronization trigger. The control unit 162a controls the attenuator 163 using the synchronization signal PSS-M. As a result, the microwave whose power is pulse-modulated so as to be synchronized with the high-frequency power is output.

Detailed Configuration of Power Feedback

First Example of Detailed Configuration

Figure 9:
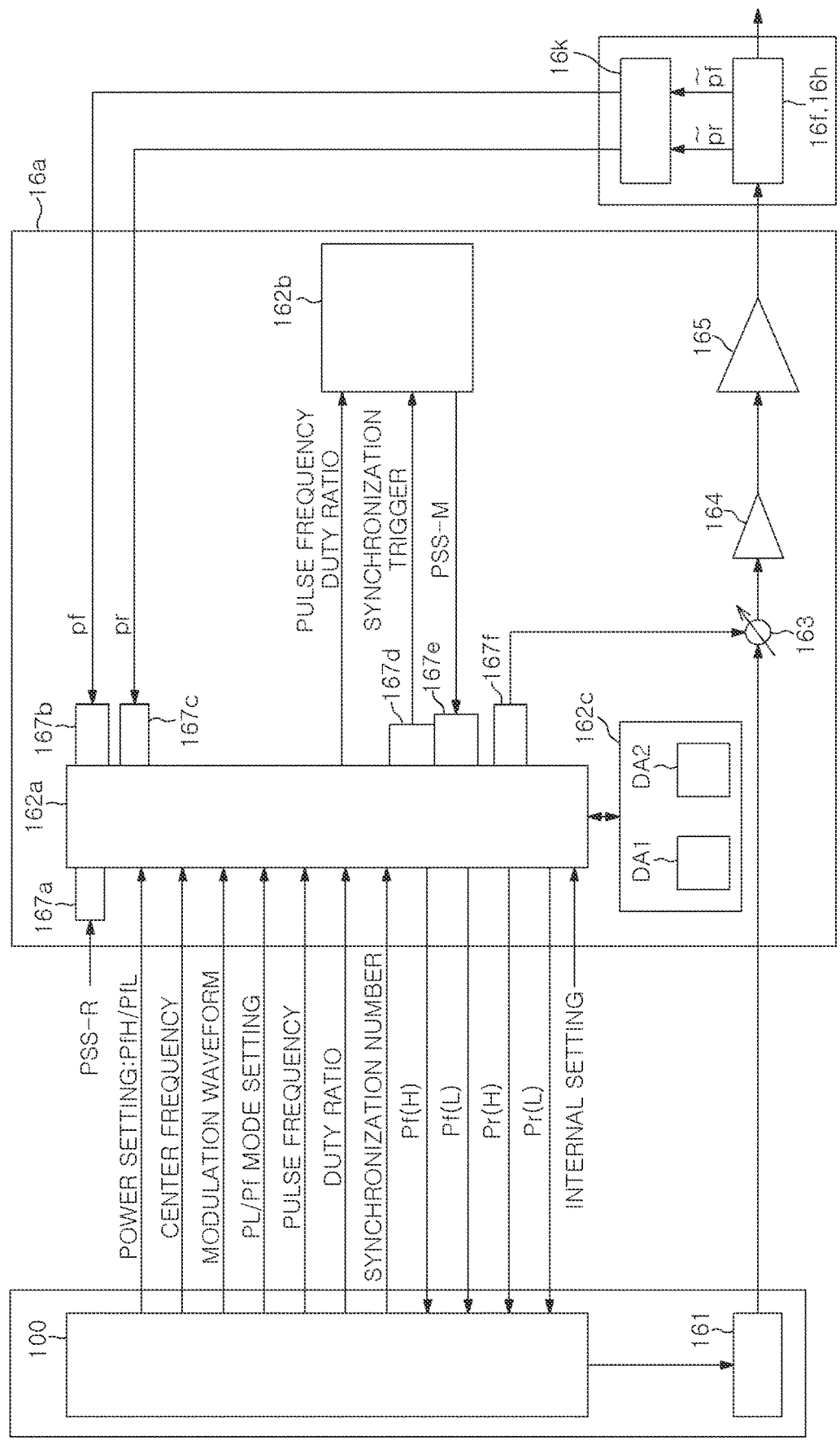
FIG. 9 is a diagram illustrating a first example of a detailed configuration related to the power feedback of the microwave output device.

FIG. 9 is a diagram illustrating a first example of a detailed configuration related to the power feedback of the microwave output device. As illustrated in FIG. 9, the control unit 162a of the microwave generation unit 16a acquires the setting profile from the controller 100. The setting profile includes at least a high-level set power PfH, a low-level set power PfL, a set pulse frequency, a duty ratio, and a synchronization number. The synchronization number is an identifier for selecting the type of synchronization. For example, at the identifier "1," the timing at which the power of the microwave becomes a high level is synchronized with the timing at which the high-frequency power becomes a high level. At the identifier "2," the timing at which the power of the microwave becomes a low level is synchronized with the timing at which the high-frequency power becomes a low level. When the synchronization number is not specified, the synchronization signal of the microwave and the high-frequency synchronization signal become asynchronous. Alternatively, one of the synchronization numbers may be allocated asynchronously. The setting profile may include the setting of the center frequency, the modulation waveform, the setting carrier pitch, and the PL/Pf mode. The modulation waveform is a set bandwidth.

The control unit 162a outputs the pulse frequency and the duty ratio acquired from the controller 100 to the pulse generator 162b.

The control unit 162a includes a pulse input device 167a. The control unit 162a acquires the synchronization signal PSS-R of the high-frequency power through the pulse input device 167a. The control unit 162a generates the synchronization trigger based on the synchronization signal PSS-R and the synchronization number. In addition, when the synchronization number is not specified, the control unit 162a may not generate the synchronization trigger. The control unit 162a includes a pulse output device 167d. The control unit 162a outputs the synchronous trigger to the pulse generator 162b via the pulse output device 167d.

The pulse generator 162b generates the synchronization signal PSS-M of the microwave based on the pulse frequency, the duty ratio, and the synchronization trigger. The pulse generator 162b generates the synchronization signal PSS-M of the microwave based on the pulse frequency and the duty ratio when the synchronization signal of the microwave and the high-frequency synchronization signal are asynchronous.

The control unit 162a determines a voltage value applied to the attenuator 163 based on the synchronization signal PSS-M. The control unit 162a outputs the applied voltage value to a D/A converter 167f. The D/A converter 167f converts a digital signal of the output (set) voltage value into an analog signal. The control unit 162a applies a voltage to the attenuator 163 through the D/A converter 167f. As a result, the pulse-modulated microwave is output from the microwave generation unit 16a.

The measurement unit 16k outputs the power of the traveling wave and the power of the reflected wave according to the microwaves output from the first directional coupler 16f and the second directional coupler 16h as a measurement value pf of the power of the traveling wave and a measurement value pr of the power of the reflected wave.

The control unit 162a includes A/D converters 167b and 167c that convert an analog signal into a digital signal. The control unit 162a acquires the measurement value pf of the power of the traveling wave and the measurement value pr of the power of the reflected wave from the measurement unit 16k via the A/D converters 167b and 167c.

The control unit 162a is configured to be able to refer to the storage unit 162c. The control unit 162a refers to definition data DA1 stored in the storage unit 162c, and can specify data to be acquired from the measurement values pf and pr. The definition data DA1 includes, for example, a mask (filter) that defines a period for sampling data points. For example, the definition data DA1 is stored in advance in the storage unit 162c by the control unit 162a inputting internal settings.

The control unit 162a refers to the definition data DA1. The control unit 162a detects a high-level measurement value pfH and a low-level measurement value pfL included in the measurement value pf of the power of the traveling wave. In addition, the control unit 162a detects a high-level measurement value prH and a low-level measurement value prL included in the measurement value pr of the power of the reflected wave. The definition data DA1 includes, as an example, a definition that an H detection mask time (first mask period) from the timing at which the power becomes the high level until the elapse of a predetermined time cannot sample the high-level measurement values pfH and prH. The definition data DA1 includes, as an example, a definition that an L detection mask time (second mask period) from the timing at which the power becomes the low level until the elapse of a predetermined time cannot sample the low-level measurement values pfL and prL. The definition data DA1 includes, as an example, a definition of measuring the high-level power in the H detection period (first sample period) from the end of the H detection mask time to the timing at which the power becomes the low level. In addition, the definition data DA1 includes a definition of measuring the low-level power in the L detection period (second sample period) from the end of the L detection mask time to the timing at which the power becomes the high level.

The control unit 162a stores the detected measurement values pfH, pfL, prH, and prL in the storage unit 162c in time series. As a result, the time series buffer DA2 is generated. The time series buffer DA2 is used for averaging the measurement values. The control unit 162a refers to the time series buffer DA2 and calculates a moving average time of each measurement value pfH, pfL, prH, and prL. The control unit 162a calculates the averaged measurement values Pf(H), Pf(L), Pr(H), and Pr(L) using each moving average time, respectively.

The control unit 162a uses the averaged measurement values Pf(H), Pf(L), Pr(H), and Pr(L) and the high-level set power PfH and the low-level set power PfL to determine the voltage value applied to the attenuator 163. The control unit 162a uses the averaged measurement value, the high-level set power PfH, and the low-level set power PfL to determine the voltage value applied to the attenuator 163 so that the output of the microwave generation unit 16a approaches the set power. For example, the control unit 162a determines a first signal (applied voltage value for the high-level power) for giving the first attenuation amount to the power of the microwave, and a second signal (applied voltage value for the low-level power) for giving the second attenuation amount to the power of the microwave. Then, the control unit 162a applies a voltage to the attenuator 163 via the D/A converter 167f. As a result, the power feedback is performed.

The control unit 162a may output the averaged measurement value to the controller 100. The averaged measurement value is stored in the storage unit of the controller 100 as operation information or log information of the device, or output to the outside of the device.

Second Example of Detailed Configuration

Figure 10:
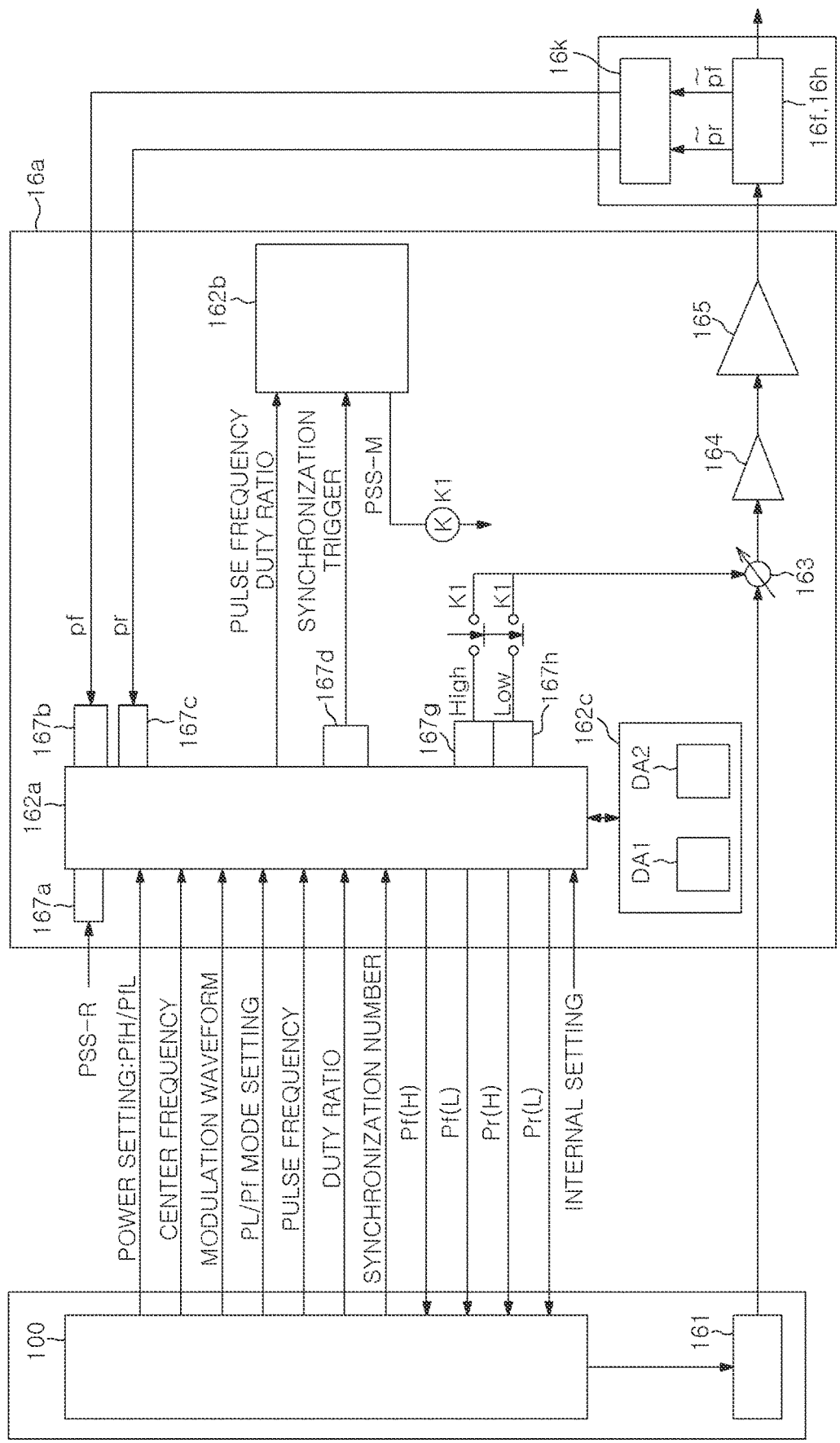
FIG. 10 is a diagram illustrating a second example of a detailed configuration related to the power feedback of the microwave output device.

FIG. 10 is a diagram illustrating a second example of a detailed configuration related to the power feedback of the microwave output device. Compared with the configuration according to the first example illustrated in FIG. 9, the configuration according to the second example includes a D/A converter 167g for a high signal and a D/A converter 167h for a low signal, instead of the D/A converter 167f. In addition, in the configuration according to the second example, the synchronization signal PSS-M is not output from the pulse output device 167d to the control unit 162a. The first example and the second example are different from each other in this respect, and the rest is the same. For this reason, description overlapping with FIG. 9 will be omitted.

The control unit 162a is connected to the D/A converter 167g (first converter) for D/A conversion of an applied voltage value for high-level power, and the D/A converter 167h (second converter) for D/A conversion of an applied voltage value for low-level power. The D/A converter 167g is preset so as to output an analog signal according to the applied voltage value for high-level power. The D/A converter 167h is preset so as to output the analog signal according to the applied voltage value for high-level power. A solid state relay K1 (switch) for switching the connection of the D/A converter 167g and the attenuator 163 and the connection of the D/A converter 167h and the attenuator 163 is provided between the D/A converter 167g, the D/A converter 167h, and the attenuator 163. The solid state relay K1 directly refers to the synchronization signal PSS-M from the pulse output device 167d and switches the connection. As a result, the configuration of the second example can switch the applied voltage value for the high-level power and the applied voltage value for the low-level power at higher speed compared to the configuration of the first example. That is, the configuration of the second example can pulse-modulate the power of the microwave in a shorter cycle compared to the configuration of the first example.

[Averaging of Power of Microwave]

The waveform of the microwave power having the bandwidth for the multi-carrier has cyclicity. As an example, when the pulse modulation is performed with a bandwidth of 10 MHz and a carrier pitch of 10 kHz, the power of the microwave is averaged with 1 cycle of 100 µs. In general, the output of the detector is an output according to amplitude, and when the output is converted into power, an error occurs when the microwave to be measured has a bandwidth for the multi-carrier and when the microwave to be measured does not have a bandwidth. In the case of having the bandwidth, if the power of the microwave is averaged with 1 cycle of 100 µs, the power measurement value matches the power converted from the detection output. In addition, by repeatedly averaging the power of the microwave 1 cycle or more, the detection output and the measurement value of the power match, and thus, the precision of the power is improved. Because the power is fed back based on this detection output, the set power matches the power measurement value. Hereinafter, this will be described based on a measurement example.

Figure 11A:
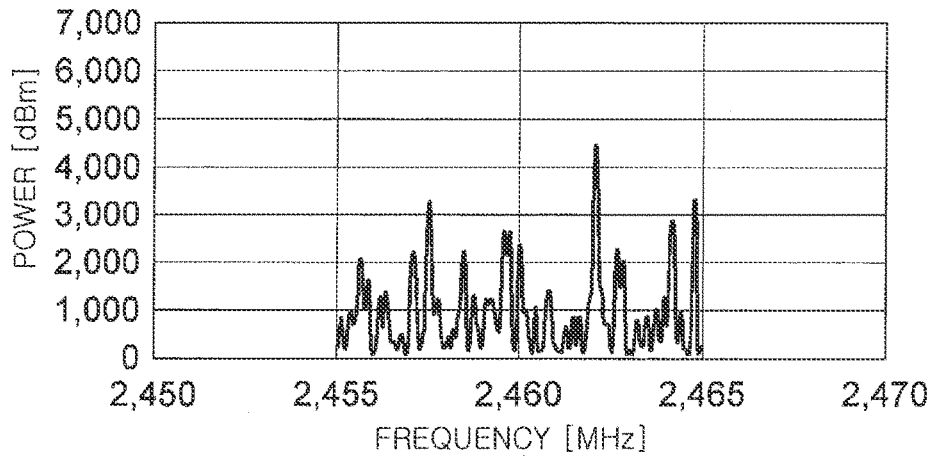
FIGS. 11A, 11B, and 11C are examples of waveforms of a microwave (without pulse modulation) having a bandwidth for a multi-carrier.
Figure 11B:
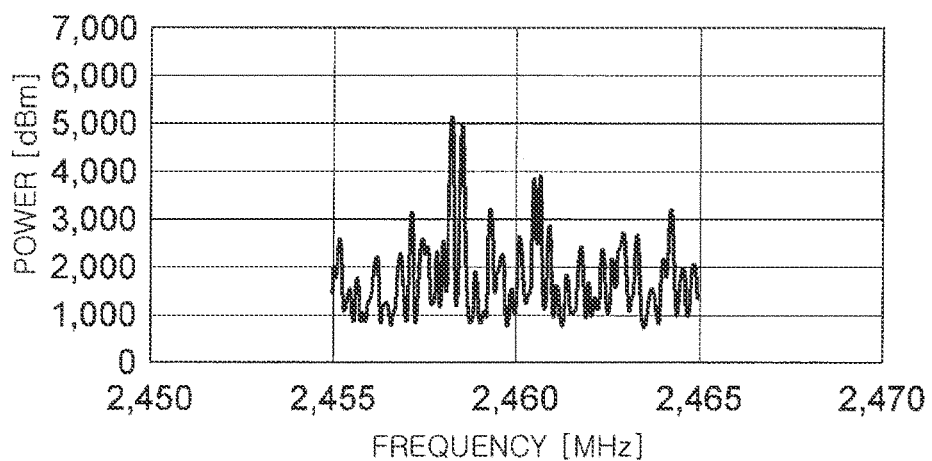
Figure 11C:
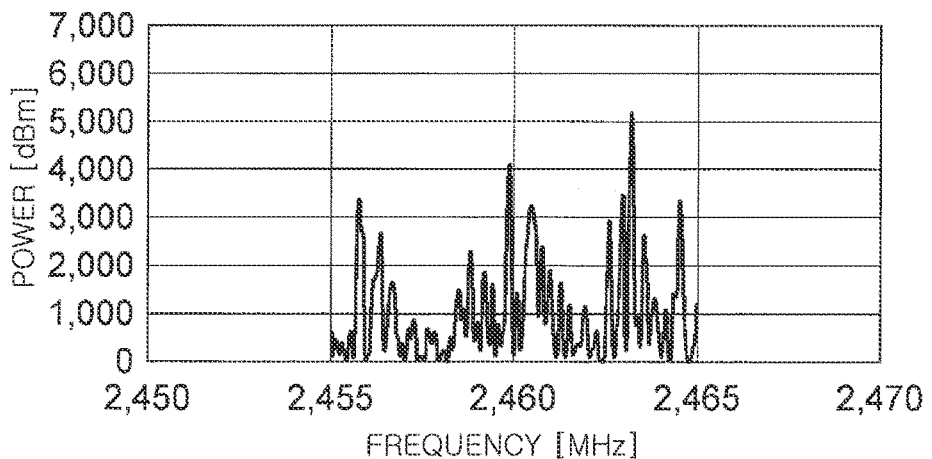

FIGS. 11A to 11C are examples of a waveform of a microwave (without pulse modulation) having a bandwidth for a multi-carrier. A horizontal axis is frequency (MHz), and a vertical axis is power (dBm). The set bandwidth (set BB width) is 10 MHz, and the set carrier pitch is 10 kHz. Sampling is performed every 1 µs between 0 µs and 100 µs. The frequency ranges from 2455 MHz to 2465 MHz, and the power ranges from 0 to 7000 W. FIG. 11A is a waveform of a microwave at time t=0 µs. FIG. 11B is a waveform of a microwave at time t=10 µs. FIG. 11C is a waveform of a microwave at time t=70 µs. As illustrated in FIGS. 11A to 11C, it was confirmed that an instantaneous waveform shape of a microwave having a bandwidth differs every 1 µs.

Figure 12A:
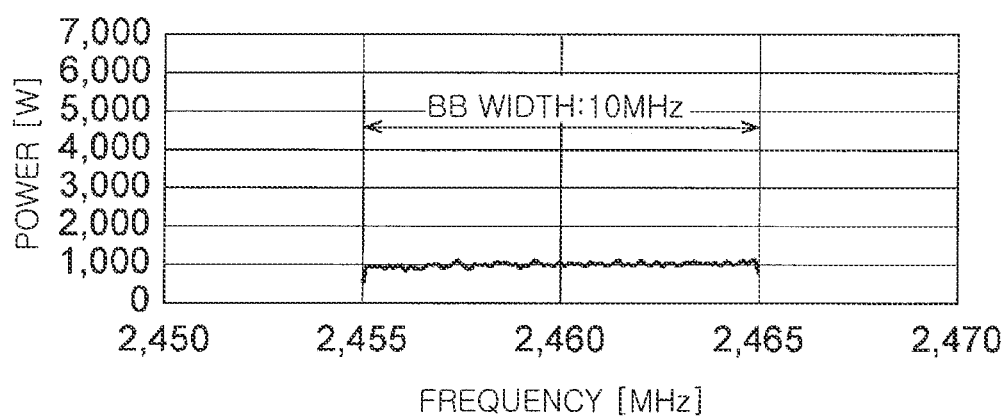
FIGS. 12A and 12B are examples of waveforms obtained by averaging the microwave illustrated in FIGS. 11A and 11B at a BB cycle.
Figure 12B:
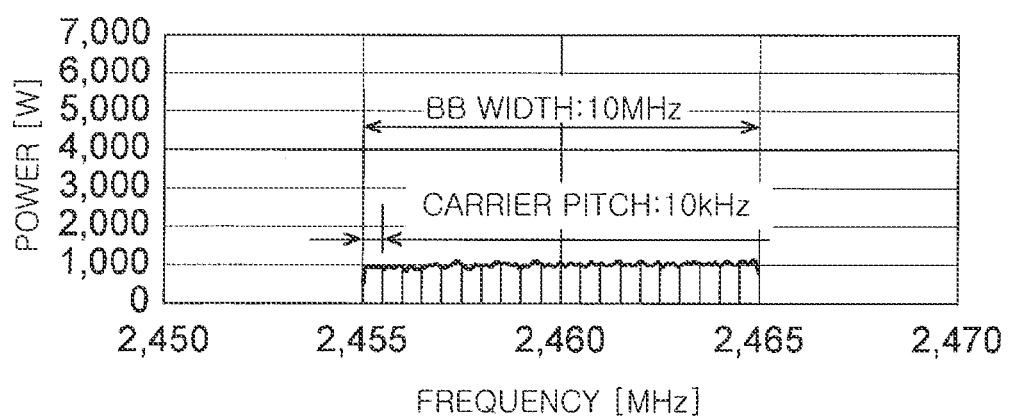

FIGS. 12A and 12B are examples of waveforms obtained by averaging the microwaves illustrated in FIG. 11 in the BB cycle. The horizontal axis is frequency (MHz), and the vertical axis is power (W). The BB cycle is a power fluctuation cycle of a microwave having a bandwidth, and here, 1 cycle is 100 µs. As illustrated in FIG. 12A, it was confirmed that, when averaging the microwaves for 1 cycle of the BB cycle, a flat waveform is obtained in a width of 10 MHz, which is a BB waveform. FIG. 12B is an example in which the resolution of the frequency axis is increased compared to the example illustrated in FIG. 12A. As illustrated in FIG. 12B, when the resolution of the frequency axis is increased, a waveform (1001 carriers) with a carrier pitch of 10 kHz was confirmed.

Figure 13A:
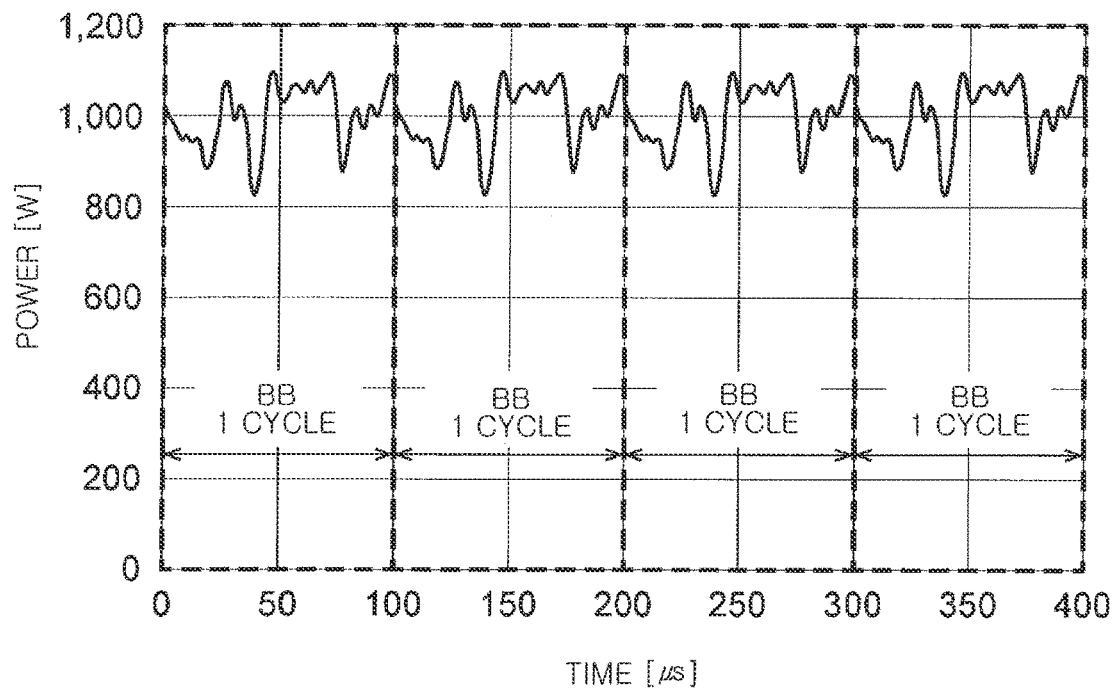
FIGS. 13A and 13B are examples of a moving average of the power of the microwave (without pulse modulation) having the bandwidth for the multi-carrier.
Figure 13B:
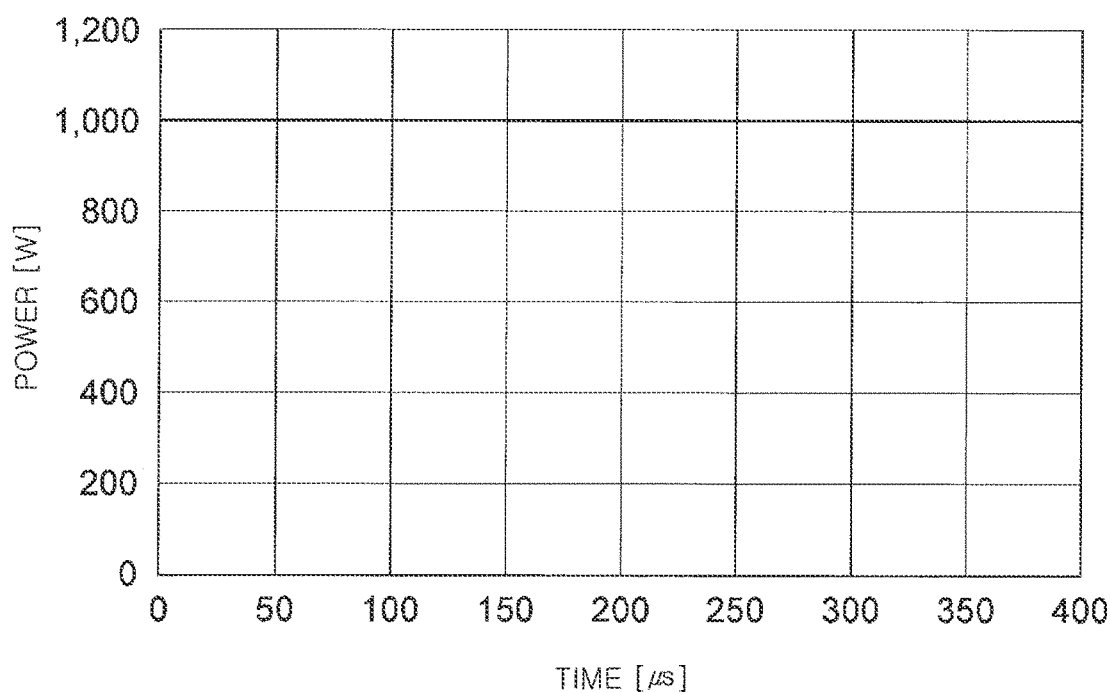

FIGS. 13A and 13B are examples of a moving average of power of a microwave (without pulse modulation) having a bandwidth for a multi-carrier. The horizontal axis is time (µs), and the vertical axis is power (W). FIG. 13A is a waveform obtained by sampling a multi-carrier of a 100 µs cycle at 1 µs under power feedback control. The bandwidth is 10 MHz, the carrier pitch is 10 kHz, and the set power is 1000 W. As illustrated in FIG. 13A, when the power feedback control is performed, repeated power fluctuations occur in the BB cycle. By performing the moving average on the waveform of FIG. 13A, the waveform illustrated in FIG. 13B can be obtained. In a multi-carrier of a 100 µs cycle, 1 µs sample data was moving-averaged to 100 pieces (100 µs). As illustrated in FIG. 13B, it was confirmed that the power becomes constant with respect to time. Meanwhile, when the details of the power fluctuation were confirmed, it was confirmed that the microwave (without pulse modulation) having a bandwidth of 10 MHz had a variation (standard deviation 68 W at the time of 1 µs sample).

Next, the waveform in the case of the pulse modulation will be described. In the case of performing the pulse modulation with a bandwidth of 10 MHz, a carrier pitch of 10 kHz, and 1 cycle of 100 µs, when cutting off is performed by the ON time and OFF time of the waveform set by the pulse frequency and the duty ratio, that is, when extraction is performed cyclically, only a specific period in 1 cycle of 100 µs is detected. Hereinafter, this will be described in detail.

Figure 14A:
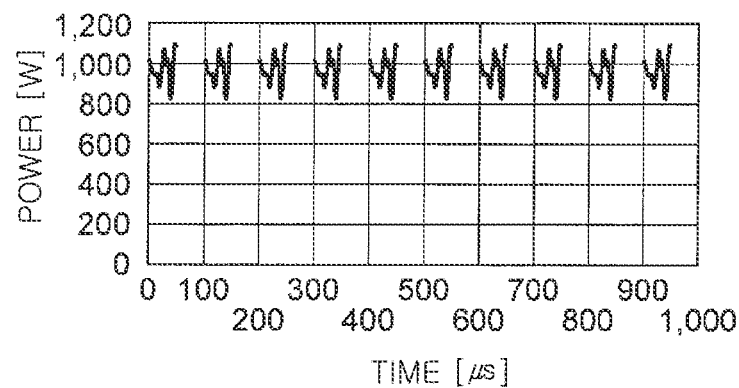
FIGS. 14A-14E are examples of detection outputs of the microwave (carrier pitch of 10 kHz, with a pulse modulation) having the bandwidth for the multi-carrier.
Figure 14B:
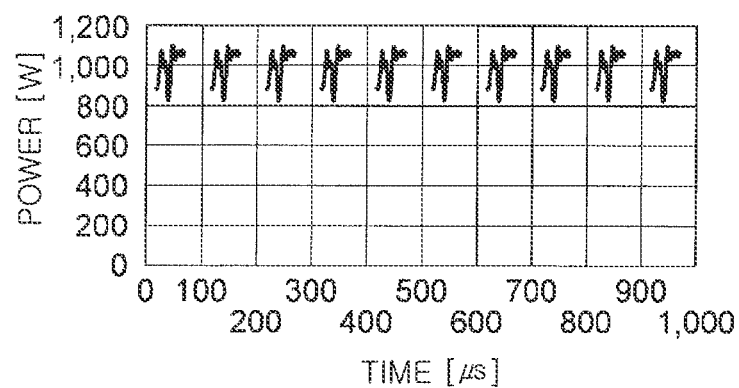
Figure 14C:
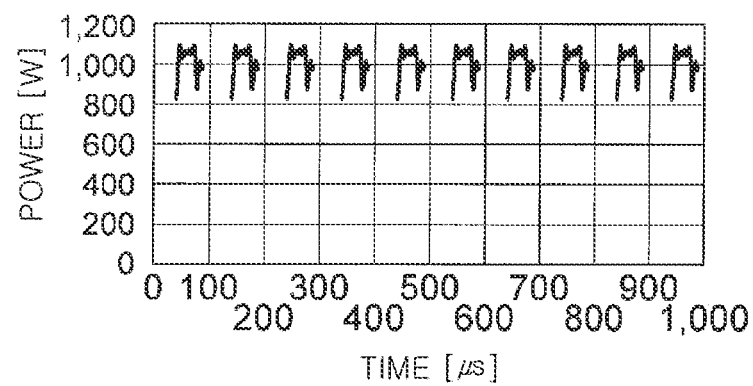
Figure 14D:
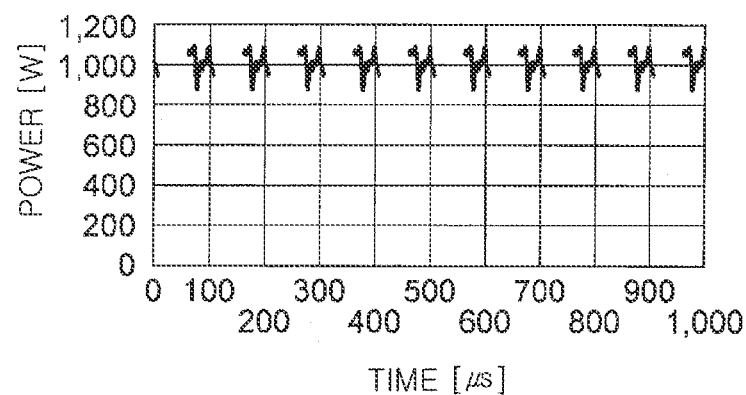
Figure 14E:
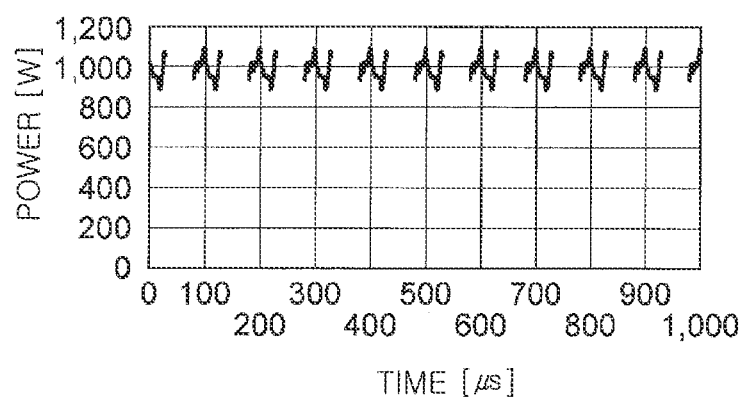

FIGS. 14A to 14E are examples of the detection output of the microwave (carrier pitch of 10 kHz, with a pulse modulation) having the bandwidth for the multi-carrier. The horizontal axis is time (µs), and the vertical axis is power (W). The set bandwidth is 10 MHz, the set carrier pitch is 10 kHz, and the set power is 1000 W. The conditions for the pulse modulation are a set frequency of 10 kHz and a set duty ratio of 50%. That is, the pulse on time is 50 µs and the pulse off time is 50 µs. In FIGS. 14A to 14E, the waveform was cut out at the pulse on time. FIG. 14A illustrates the measurement results in a case where the pulse modulation is started when t=0 µs. FIG. 14B illustrates a waveform in a case where the pulse modulation is started when t=20 µs. FIG. 14C illustrates a waveform in a case where the pulse modulation is started when t=40 µs. FIG. 14D illustrates a waveform in a case where the pulse modulation is started when t=60 µs. FIG. 14E illustrates a waveform in a case where the pulse modulation is started when t=80 µs. As illustrated in FIGS. 14A to 14E, it was confirmed that the shape of the waveform changes according to the start timing of the pulse modulation, and the detection output changes.

FIG. 15 is a table summarizing measurement results of the power of the microwave (carrier pitch of 10 kHz, with a pulse modulation) having the bandwidth for the multi-carrier. Average power, standard deviation (variation), maximum power, and minimum power were measured for start timing of each pulse modulation. The start timing of the pulse modulation was set to 0 µs to 90 µs. As illustrated in FIG. 15, the average power, the standard deviation (variation), the maximum power, and the minimum power change were confirmed for start timing of each pulse modulation, respectively. This is because the waveform cut out at the pulse on time is less than 1 cycle of the BB cycle.

As a countermeasure against such power fluctuations depending on the start timing of the pulse modulation, the set on time and BB cycle of the pulse modulation are set so that the following conditions are satisfied.

Set Pulse on Time>BB Cycle

That is, various parameters are set so as to satisfy the relationship that the pulse on time determined by the set pulse frequency and the set duty ratio is longer than the power fluctuation cycle of the microwave having the bandwidth. As a result, it is possible to ensure the power fluctuation for 1 cycle of the microwave having the bandwidth. The pulse on time can be adjusted by changing the set pulse frequency and the set duty ratio. The BB cycle can be changed by adjusting the BB width and the carrier pitch. For this reason, the BB cycle can be adjusted suitably so as to satisfy the condition. In addition, when making it possible to execute a plurality of set pulse on times in the plasma processing apparatus, it is necessary to satisfy the condition that the minimum value of the set pulse on time is longer than the BB cycle. Similarly, when a plurality of BB cycles can be executed in the plasma processing apparatus, it is necessary to satisfy the condition that the maximum value of the BB cycle is shorter than the pulse on time.

FIG. 16 is a table showing an example of the pulse on time. As illustrated in FIG. 16, when the set pulse frequency is 1 kHz and the set duty ratio is 10%, the pulse cycle is 1000 µs and the pulse on time is 100 µs. When the set pulse frequency is 1 kHz and the set duty ratio is 90%, the pulse cycle is 1000 µs and the pulse on time is 900 µs. When the set pulse frequency is 5 kHz and the set duty ratio is 10%, the pulse cycle is 200 µs and the pulse on time is 20 µs. When the set pulse frequency is 5 kHz and the set duty ratio is 90%, the pulse cycle is 200 µs and the pulse on time is 180 µs. When the set pulse frequency is 10 kHz and the set duty ratio is 10%, the pulse cycle is 100 µs and the pulse on time is 10 µs. When the set pulse frequency is 10 kHz and the set duty ratio is 90%, the pulse cycle is 100 µs and the pulse on time is 90 µs. When the set pulse frequency is 15 kHz and the set duty ratio is 10%, the pulse cycle is 66.6 µs and the pulse on time is 6.66 µs. When the set pulse frequency is 15 kHz and the set duty ratio is 90%, the pulse cycle is 66.6 µs and the pulse on time is 59.94 µs. When the set pulse frequency is 20 kHz and the set duty ratio is 10%, the pulse cycle is 50 µs and the pulse on time is 5 µs. When the set pulse frequency is 20 kHz and the set duty ratio is 90%, the pulse cycle is 50 µs and the pulse on time is 45 µs. When the set pulse frequency is 50 kHz and the set duty ratio is 10%, the pulse cycle is 20 µs and the pulse on time is 2 µs. When the set pulse frequency is 50 kHz and the set duty ratio is 90%, the pulse cycle is 20 µs and the pulse on time is 18 µs. In this way, the pulse on time can be adjusted by changing the set pulse frequency and the set duty ratio.

FIG. 17 is a table showing an example of the carrier pitch, the BB period, and the pulse on time. As illustrated in FIG. 17, in the case of a single peak SP, the number of carriers is 1. When the set BB width is 10 MHz and the set carrier pitch is 10 kHz, the number of carriers is 1001 and the BB cycle is 100 µs. When the set BB width is 10.1 MHz and the set carrier pitch is 10 kHz, the number of carriers is 1001 and the BB cycle is 99.0099 µs. In this case, the pulse on time (the minimum value of) may be set to 100 µs. When the set BB width is 10.01 MHz and the set carrier pitch is 100.1 kHz, the number of carriers is 101 and the BB cycle is 9.999 µs. In this case, the pulse on time (the minimum value of) may be set to 10 µs. When the set BB width is 10.005 MHz and the set carrier pitch is 200.1 kHz, the number of carriers is 51 and the BB cycle is 4.9975 µs. In this case, the pulse on time (the minimum value of) may be set to 5 µs. When the set BB width is 1.0002 MHz and the set carrier pitch is 500.1 kHz, the number of carriers is 3 and the BB cycle is 1.9996 µs. In this case, the pulse on time (the minimum value of) may be set to 2 µs. When the set BB width is 2.5005 MHz and the set carrier pitch is 500.1 kHz, the number of carriers is 6 and the BB cycle is 1.9996 µs. In this case, the pulse on time (the minimum value of) may be set to 2 µs. When the set BB width is 5.001 MHz and the set carrier pitch is 500.1 kHz, the number of carriers is 11 and the BB cycle is 1.9996 µs. In this case, the pulse on time (the minimum value of) may be set to 2 µs. When the set BB width is 10.002 MHz and the set carrier pitch is 500.1 kHz, the number of carriers is 21 and the BB cycle is 1.9996 µs. In this case, the pulse on time (the minimum value of) may be set to 2 µs. When the set BB width is 20.004 MHz and the set carrier pitch is 500.1 kHz, the number of carriers is 41 and the BB cycle is 1.9996 µs. In this case, the pulse on time (the minimum value of) may be set to 2 µs. When the set BB width is 50.01 MHz and the set carrier pitch is 500.1 kHz, the number of carriers is 101 and the BB cycle is 1.9996 µs. In this case, the pulse on time (the minimum value of) may be set to 2 µs. When the set BB width is 99.5199 MHz and the set carrier pitch is 500.1 kHz, the number of carriers is 200 and the BB cycle is 1.9996 µs. In this case, the pulse on time (the minimum value of) may be set to 2 µs. In this way, the BB cycle can be changed by adjusting the BB width and the carrier pitch. That is, by adjusting at least one of the set pulse frequency, the set duty ratio, the BB width, and the carrier pitch, changes can be made so as to satisfy the relationship of set pulse on time>BB cycle.

Figure 18A:
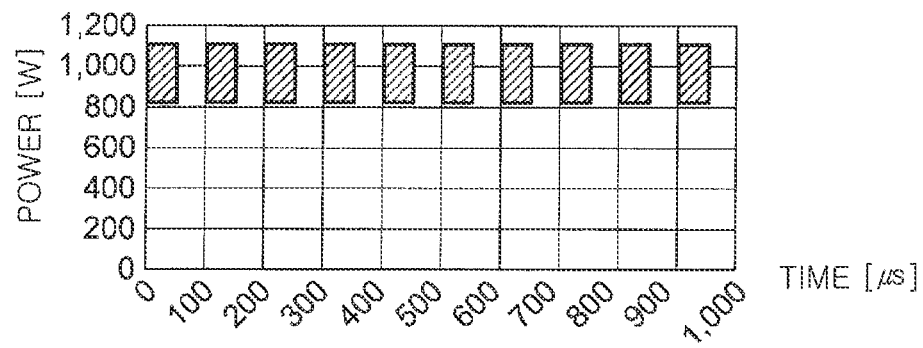
FIGS. 18A-18E are examples of the detection outputs of the microwave (carrier pitch of 500.1 kHz, with the pulse modulation) having the bandwidth for the multi-carrier.
Figure 18B:
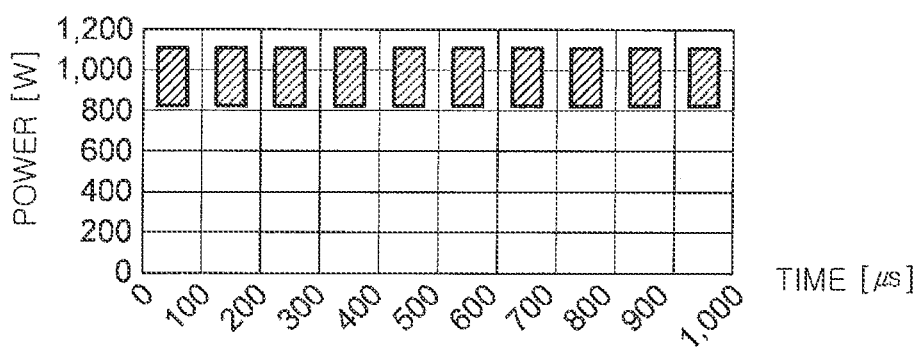
Figure 18C:
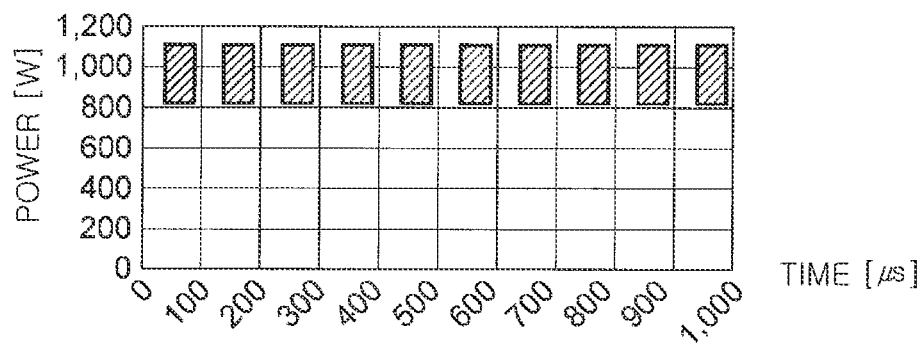
Figure 18D:
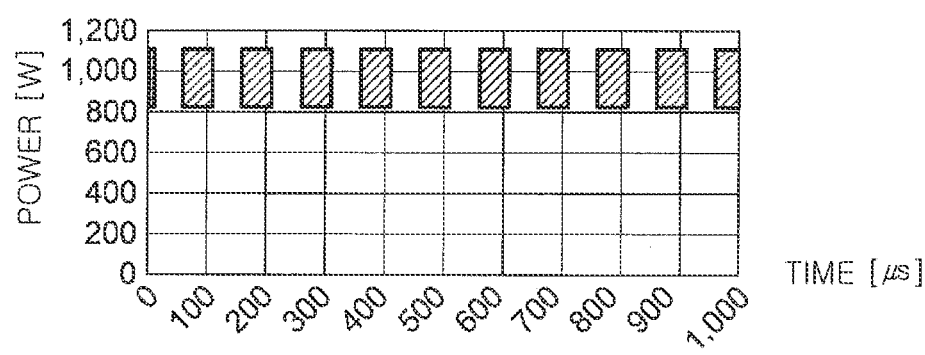
Figure 18E:
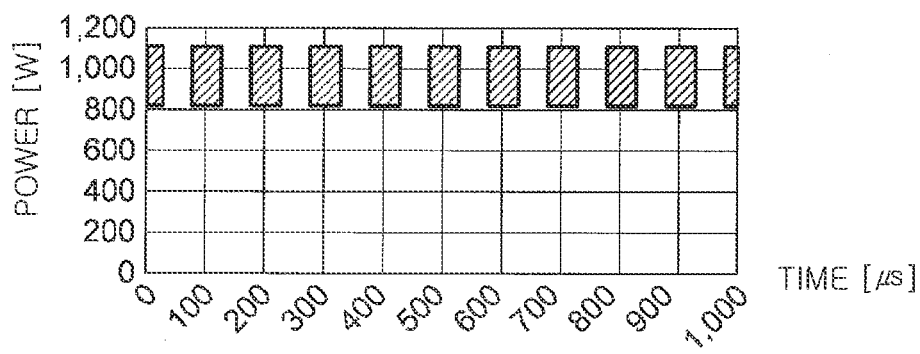

FIGS. 18A to 18E are examples of the detection output of the microwave (carrier pitch of 500.1 kHz, with a pulse modulation) having the bandwidth for the multi-carrier. The horizontal axis is time (µs), and the vertical axis is power (W). The set bandwidth is 10.002 MHz, the set carrier pitch is 500.1 kHz, and the set power is 1000 W. That is, the BB cycle is 1.9996 µs. The conditions for the pulse modulation are a set frequency of 10 kHz and a set duty ratio of 50%. That is, the pulse on time is 50 µs and the pulse off time is 50 µs. The pulse on time is about 25 times the BB cycle. In FIGS. 18A to 18E, the waveform was cut out for the pulse on time. FIG. 18A illustrates the measurement results in a case where the pulse modulation is started when t=0 µs. FIG. 18B illustrates a waveform in a case where the pulse modulation is started when t=20 µs. FIG. 18C illustrates a waveform in a case where the pulse modulation is started when t=40 µs. FIG. 18D illustrates a waveform in a case where the pulse modulation is started when t=60 µs. FIG. 18E illustrates a waveform in a case where the pulse modulation is started when t=80 µs. As illustrated in FIGS. 18A to 18E, it was confirmed that the shape of the waveform is uniform regardless of the start timing of the pulse modulation, and thus, the detection output is stabilized.

FIG. 19 is a table summarizing measurement results of the power of the microwave (carrier pitch of 500.1 kHz, with the pulse modulation) having the bandwidth for the multi-carrier. The average power, the standard deviation (variation), the maximum power, and the minimum power were measured for start timing of each pulse modulation. The start timing of the pulse modulation was set to 0 µs to 90 µs. As illustrated in FIG. 19, it was confirmed that the average power, the standard deviation (variation), the maximum power, and the minimum power is uniform regardless of the start timing of the pulse modulation, respectively. This is because the waveform cut out at the pulse on time satisfies 1 cycle or more of the BB cycle. By comparing FIGS. 15 and 19, it was confirmed that the pulse on time satisfies the relationship that the power fluctuation cycle of the microwave having the bandwidth is longer than that of the microwave having the bandwidth, and a stable microwave input can be realized at each pulse. That is, it was confirmed that the power input of each pulse was stabilized while ensuring the robustness of plasma by the microwaves having the bandwidth.

[Improvement of Averaging of Power of Microwave]

Figure 20:
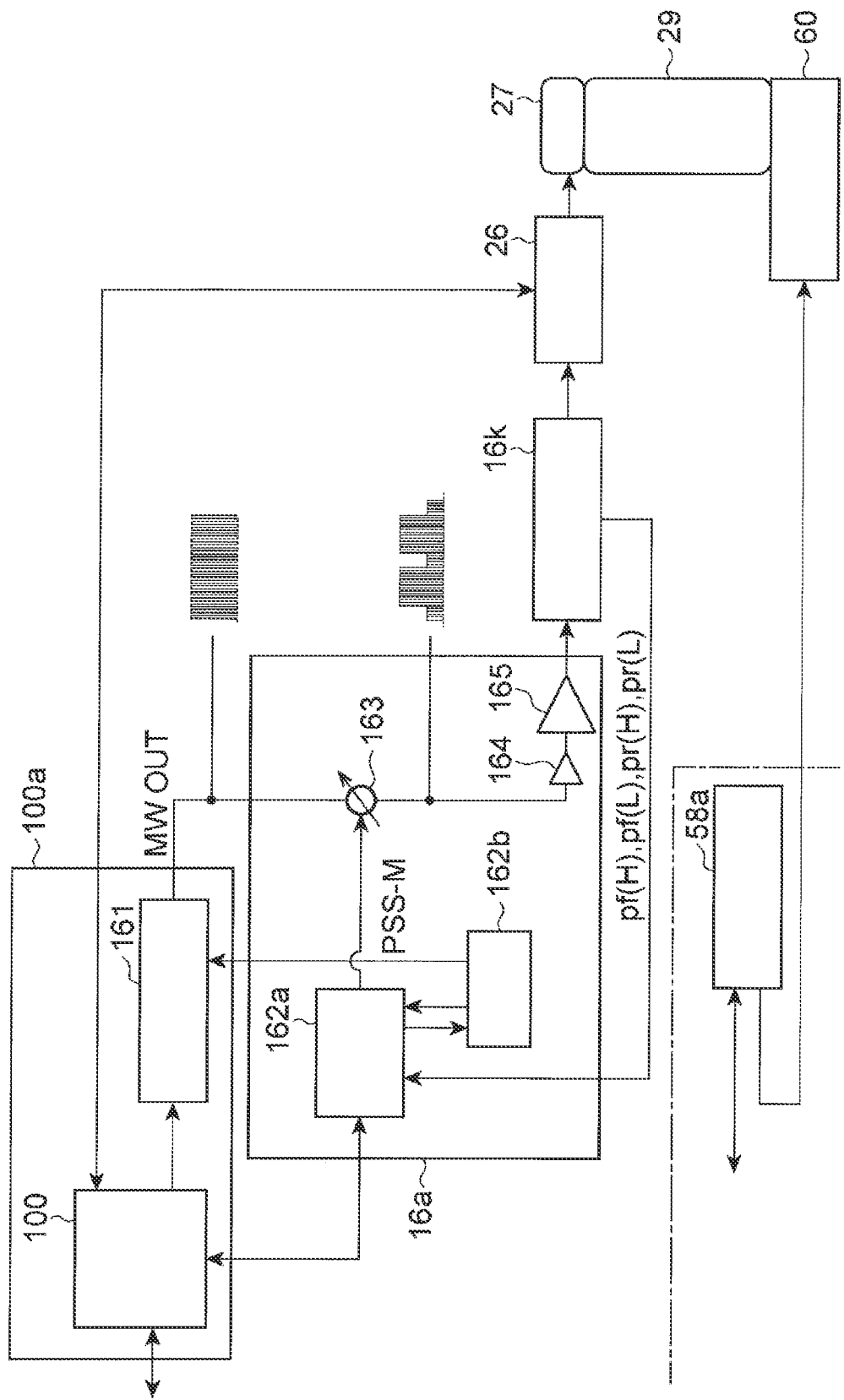
FIG. 20 is a diagram illustrating another example of a configuration related to the power feedback of the microwave.

FIG. 20 is a diagram illustrating another example of a configuration related to the power feedback of the microwave. The configuration illustrated in FIG. 20 is different from the configuration illustrated in FIG. 7 in that the pulse generator 162b and the waveform generator 161 are communicatively connected by a cable or the like, and the rest is the same. Hereinafter, the description will be focused on the differences, and overlapping descriptions will not be repeated.

Figure 21A:
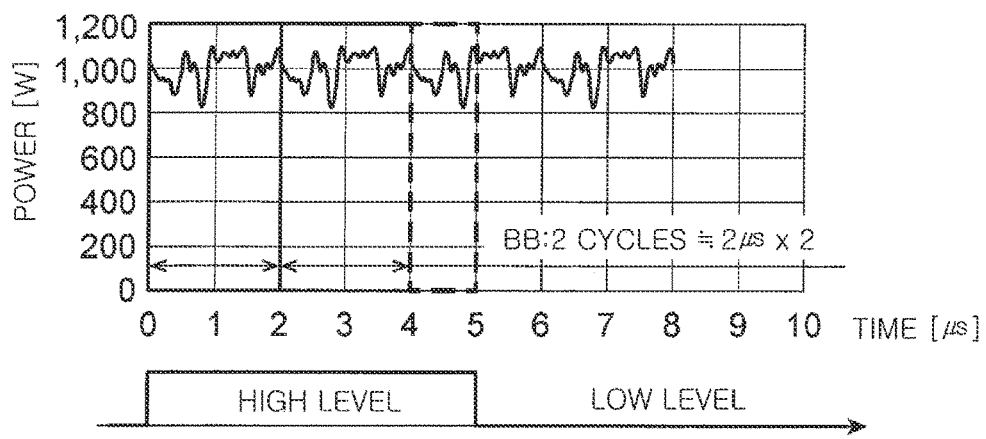
FIGS. 21A-21C are diagrams for describing a timing of a pulse ON signal and the BB cycle.
Figure 21B:
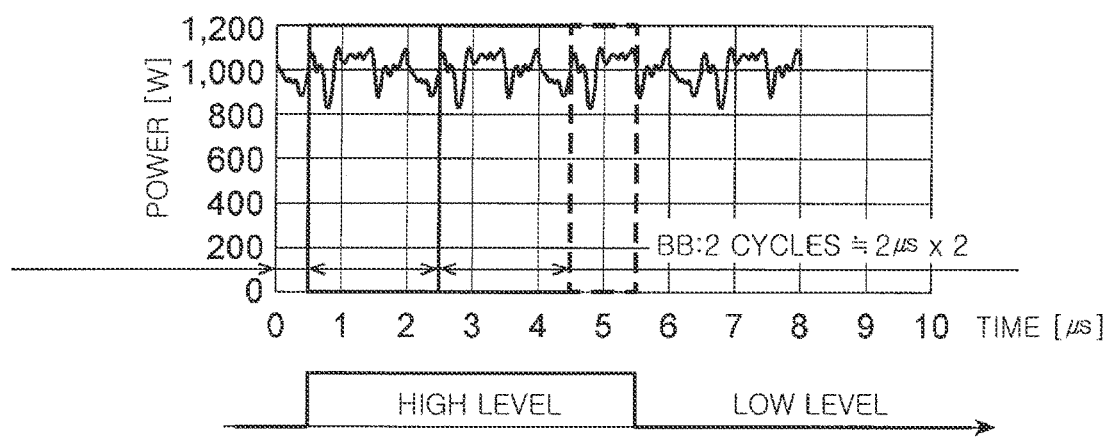
Figure 21C:
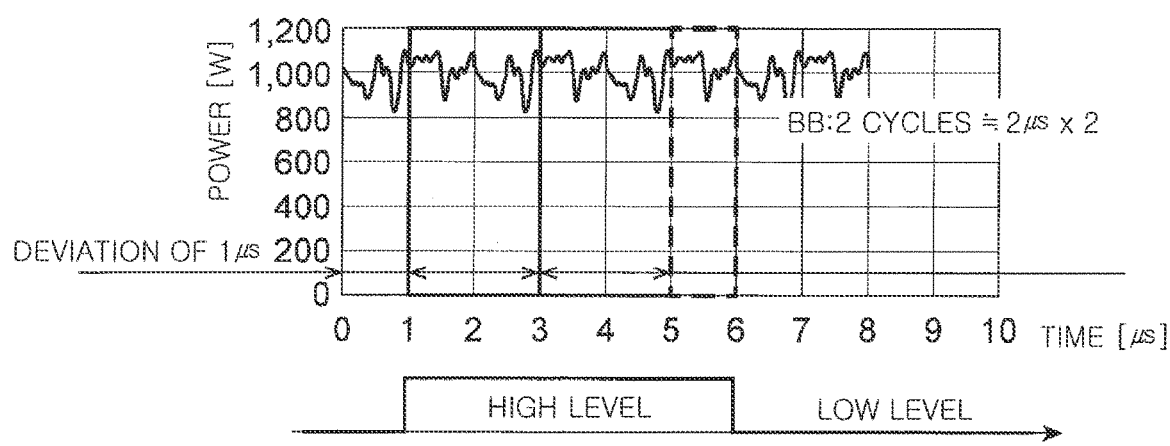

The synchronization signal PSS-M generated by the pulse generator 162b is transmitted to the waveform generator 161. The waveform generator 161 generates the waveform of the microwave at a timing based on the synchronization signal PSS-M. As a result, it is possible to synchronize the output of the microwave having the bandwidth and the pulse signal. As described above, when the relationship that the pulse on time is longer than the BB cycle can be satisfied, the stable input of the microwave can be realized at each pulse. However, as the BB cycle and the pulse on time become closer to each other, there is a risk that the average power and the variation become unstable. FIGS. 21A to 21C are diagrams for describing the timing of the pulse on signal and the BB cycle. The horizontal axis is time (µs), and the vertical axis is power (W). A time chart below the graph shows the timing of the pulse on time (high level) and the pulse off time (low level). The waveform illustrated in FIG. 21A is a case where the pulse on time is started together with the start of the BB cycle. The waveform illustrated in FIG. 21B is a case where the pulse on time is started with a deviation of 0.5 µs from the start of the BB cycle. The waveform illustrated in FIG. 21C is a case where the pulse on time is started with a deviation of 1.0 µs from the start of the BB cycle. As illustrated in FIGS. 21A to 21C, it can be seen that a change occurs in the shape of the waveform appearing in the remainder (dashed line in the drawings) of the pulse on time. For this reason, since the waveforms of each pulse can be made constant by synchronizing the output of the microwave having the bandwidth and the pulse signal, average power, and therefore, the average power and variation can be more stable.

As described above, various embodiments are described but are not limited to the above-described embodiment, and various modified forms can be configured.

Although the above-described embodiment describes the example in which the microwave generation unit 16a and the waveform generator 161 are separated, it may be configured as one apparatus.

In the above-described embodiment, an example of generating the synchronization signal of the power of the microwave according to the synchronization signal of the high-frequency power has been described, but there may be the case where the synchronization signal of the high-frequency power may be generated according to the synchronization signal of the power of the microwave power.

When the plasma processing apparatus 1 uses only the Pf mode, the measurement unit 16k may not have a configuration for measuring the reflected wave.

In the above-described embodiment, an example of using a pulse of on/off control has been described, but it is also applicable to a case where a pulse of high/low control is used. In this case, the pulse on (high level) time may be longer than the power fluctuation cycle of the microwave having the bandwidth, and the pulse off (low level) time may be longer than the power fluctuation cycle of the microwave having the bandwidth.

From the above description, it will be understood that various changes can be made to various embodiments of the present disclosure without departing from the scope and spirit of the present disclosure. Accordingly, various embodiments disclosed in the present specification are not intended to be limited, and the true scope and knowledge are shown by the appended claims.

The microwave power control described above can also be applied to the power control of a pulse-modulated RF signal (RF power). For example, the plasma processing apparatus illustrated in FIG. 1 may be changed to a plasma processing apparatus of capacitively coupled plasma (CCP) or inductively coupled plasma (ICP). The microwave output device 16 for plasma formation illustrated in FIG. 1 (an example of a power supply unit) may be changed to a high-frequency power supply (an example of a power supply unit) that applies a high frequency of an RF signal. The high-frequency power supply is coupled to the chamber body 12 through at least one impedance matching circuit. In an embodiment, the RF signal has a frequency within the range of 13 MHz to 150 MHz. As a result, plasma is formed from the processing gas supplied to the processing space S. The RF signal from the high-frequency power supply and/or high-frequency power supply 58 may be pulsed. The pulsed RF signal is set so that the pulse on time determined by the set pulse frequency and the set duty ratio is longer than the power fluctuation cycle of the high frequency wave having the bandwidth, similar to the microwave described above. As a result, it is possible to realize the stable high-frequency input at each pulse.

The invention claimed is:

1. A plasma processing apparatus comprising:
a chamber body; and
a power supply unit configured to output power for exciting a gas supplied to an inside of the chamber body,
wherein the power supply unit supplies, as power having a center frequency, a bandwidth, and a carrier pitch respectively corresponding to a set frequency, a set bandwidth, and a set carrier pitch that are indicated by a controller, power which is pulse-modulated so as to be a pulse frequency, a duty ratio, a high level, and a low level respectively corresponding to a set pulse frequency, a set duty ratio, a high-level set power, and a low-level set power indicated by the controller, and in which a pulse on time determined by the set pulse frequency and the set duty ratio is longer than a power fluctuation cycle of the power having the bandwidth.

2. The plasma processing apparatus of claim 1, wherein the power supply unit includes:
a microwave generation unit configured to generate a pulse-modulated microwave as the power;
an output unit configured to output a microwave propagated from the microwave generation unit;
a first directional coupler configured to output a part of a traveling wave propagated from the microwave generation unit to the output unit; and
a measurement unit configured to determine a first high measurement value and a first low measurement value respectively indicating a high level and a low level of power of the traveling wave in the output unit based on the part of the traveling wave output from the first directional coupler, and
wherein the microwave generation unit averages the first high measurement value and the first low measurement value at a predetermined moving average time and a predetermined sampling interval,
controls high-level power of the pulse-modulated microwave based on the averaged first high measurement value and the high-level set power, and
controls low-level power of the pulse-modulated microwave based on the averaged first low measurement value and the low-level set power.

3. The plasma processing apparatus of claim 2, wherein the power supply unit further includes a second directional coupler that outputs a part of a reflected wave returning to the output unit,
the measurement unit further determines a second high measurement value and a second low measurement value respectively indicating a high level and a low level of power of the reflected wave in the output unit based on the part of the traveling wave output from the second directional coupler, and
the microwave generation unit averages the second high measurement value and the second low measurement value at the predetermined moving average time and the predetermined sampling interval,
controls high-level power of the pulse-modulated microwave based on the averaged first high measurement value, the averaged second high measurement value, and the high-level set power, and
controls low-level power of the pulse-modulated microwave based on the averaged first low measurement value, the averaged second low measurement value, and the low-level set power.

4. The plasma processing apparatus of claim 2, wherein a pulse low time determined by the set pulse frequency and the set duty ratio is longer than a power fluctuation cycle of the microwave having the bandwidth.

5. The plasma processing apparatus of claim 1, wherein the low level is zero.

* * * * *